United States Patent
Matsuda et al.

(10) Patent No.: US 11,470,722 B2
(45) Date of Patent: Oct. 11, 2022

(54) CURRENT INTRODUCTION TERMINAL, AND PRESSURE HOLDING APPARATUS AND X-RAY IMAGE SENSING APPARATUS THEREWITH

(71) Applicant: RIKEN, Saitama (JP)

(72) Inventors: Yuji Matsuda, Wako (JP); Takashi Kameshima, Wako (JP); Osami Sugata, Wako (JP); Toshiaki Tosue, Wako (JP)

(73) Assignee: RIKEN, Saitama (JP)

( * ) Notice: Subject to any disclaimer, the term of this patent is extended or adjusted under 35 U.S.C. 154(b) by 33 days.

(21) Appl. No.: 16/755,479

(22) PCT Filed: Oct. 5, 2018

(86) PCT No.: PCT/JP2018/037464
§ 371 (c)(1),
(2) Date: Apr. 10, 2020

(87) PCT Pub. No.: WO2019/073936
PCT Pub. Date: Apr. 18, 2019

(65) Prior Publication Data
US 2021/0168936 A1  Jun. 3, 2021

(30) Foreign Application Priority Data
Oct. 11, 2017  (JP) .............................. JP2017-197477

(51) Int. Cl.
*H05K 1/00* (2006.01)
*H05K 1/02* (2006.01)
(Continued)

(52) U.S. Cl.
CPC ............. *H05K 1/147* (2013.01); *H05K 1/184* (2013.01); *H05K 3/4061* (2013.01); *H05K 2201/10545* (2013.01)

(58) Field of Classification Search
CPC .. H05K 1/00; H05K 1/02; H05K 1/03; H05K 1/09; H05K 1/11; H05K 1/18; H05K 3/10;
(Continued)

(56) References Cited

U.S. PATENT DOCUMENTS

| | | |
|---|---|---|
| 5,497,546 A | 3/1996 | Kubo et al. |
| 6,229,404 B1 * | 5/2001 | Hatanaka .................. H03B 5/04 |
| | | 257/698 |

(Continued)

FOREIGN PATENT DOCUMENTS

| | | |
|---|---|---|
| CN | 1342041 A | 3/2002 |
| CN | 103477501 A | 12/2013 |

(Continued)

OTHER PUBLICATIONS

Extended European Search Report issued in the counterpart European Patent Application No. 18866796.8, dated Jun. 14, 2021 (9 pages).

(Continued)

*Primary Examiner* — Xiaoliang Chen
(74) *Attorney, Agent, or Firm* — Osha Bergman Watanabe & Burton LLP

(57) ABSTRACT

A current introduction terminal includes a board made of resin. The board has a first face and a second face opposite each other. The board hermetically separates environments of different air pressures from each other. A plurality of through via holes corresponding both to a plurality of metal terminals of a first surface-mount connector to be mounted on the first face and to a plurality of metal terminals of a second surface-mount connector to be mounted on the second face are formed to penetrate between the first and second faces, and then hole parts of the through via holes are filled with resin.

14 Claims, 20 Drawing Sheets

(51) Int. Cl.
| | | |
|---|---|---|
| *H05K 1/03* | (2006.01) | |
| *H05K 1/09* | (2006.01) | |
| *H05K 1/11* | (2006.01) | |
| *H05K 1/18* | (2006.01) | |
| *H05K 3/10* | (2006.01) | |
| *H05K 3/30* | (2006.01) | |
| *H05K 3/40* | (2006.01) | |
| *H05K 5/00* | (2006.01) | |
| *H05K 7/14* | (2006.01) | |
| *H01L 21/02* | (2006.01) | |
| *H01L 21/30* | (2006.01) | |
| *H01L 21/50* | (2006.01) | |
| *H01L 21/56* | (2006.01) | |
| *H01L 21/58* | (2006.01) | |
| *H01L 23/02* | (2006.01) | |
| *H01L 23/055* | (2006.01) | |
| *H01L 23/06* | (2006.01) | |
| *H01L 23/08* | (2006.01) | |
| *H01L 23/10* | (2006.01) | |
| *H01L 23/12* | (2006.01) | |
| *H01L 23/28* | (2006.01) | |
| *H01L 23/31* | (2006.01) | |
| *H01L 23/34* | (2006.01) | |
| *H01L 23/36* | (2006.01) | |
| *H01L 23/48* | (2006.01) | |
| *H01L 23/52* | (2006.01) | |
| *H01L 23/58* | (2006.01) | |
| *H01L 23/62* | (2006.01) | |
| *H01L 23/488* | (2006.01) | |
| *H01L 23/498* | (2006.01) | |
| *H01L 23/528* | (2006.01) | |
| *H01L 23/538* | (2006.01) | |
| *H01L 41/04* | (2006.01) | |
| *H01L 41/047* | (2006.01) | |
| *H01L 41/053* | (2006.01) | |
| *H01L 41/08* | (2006.01) | |
| *H01L 41/18* | (2006.01) | |
| *H01L 41/22* | (2013.01) | |
| *H01L 41/23* | (2013.01) | |
| *H01L 41/29* | (2013.01) | |
| *H05K 1/14* | (2006.01) | |

(58) Field of Classification Search
CPC .. H05K 3/30; H05K 3/40; H05K 5/00; H05K 7/14; H01L 21/02; H01L 21/30; H01L 21/50; H01L 21/56; H01L 21/58; H01L 23/02; H01L 23/055; H01L 23/06; H01L 23/08; H01L 23/10; H01L 23/12; H01L 23/28; H01L 23/31; H01L 23/34; H01L 23/36; H01L 23/48; H01L 23/52; H01L 23/58; H01L 23/62; H01L 23/488; H01L 23/498; H01L 23/528; H01L 23/538; H01L 41/04; H01L 41/047; H01L 41/053; H01L 41/08; H01L 41/18; H01L 41/22; H01L 41/23; H01L 41/29
USPC ........ 361/749, 752, 753, 760; 174/257, 520, 174/539, 564; 310/311, 312, 313 R, 340, 310/344, 348, 366; 347/68; 368/47, 159
See application file for complete search history.

(56) References Cited

U.S. PATENT DOCUMENTS

| | | | | |
|---|---|---|---|---|
| 6,285,067 | B1* | 9/2001 | Hyoudo | H01L 23/10 257/529 |
| 7,211,934 | B2* | 5/2007 | Fujiwara | B81B 7/007 310/313 R |
| 7,528,523 | B2* | 5/2009 | Aoki | H03H 3/08 310/313 R |
| 8,415,862 | B2* | 4/2013 | Sugiyama | H03H 9/1021 310/344 |
| 9,591,770 | B2 | 3/2017 | Haynes et al. | |
| 2002/0023765 | A1* | 2/2002 | Sugiura | H03H 3/08 174/564 |
| 2002/0041016 | A1* | 4/2002 | Hyodo | H01L 23/10 257/678 |
| 2003/0093895 | A1* | 5/2003 | Miyazaki | B81B 7/007 29/622 |
| 2004/0217451 | A1* | 11/2004 | Lee | H01L 23/055 257/666 |
| 2005/0001331 | A1* | 1/2005 | Kojima | H01L 27/14643 257/778 |
| 2005/0040905 | A1* | 2/2005 | Hatanaka | H03L 1/04 331/176 |
| 2005/0146397 | A1* | 7/2005 | Koga | H03H 9/1085 333/133 |
| 2006/0055013 | A1* | 3/2006 | Ito | H03H 9/0552 257/678 |
| 2006/0097405 | A1* | 5/2006 | Webster | H01L 24/48 257/782 |
| 2007/0012654 | A1* | 1/2007 | Kim | H01H 61/02 216/2 |
| 2007/0058003 | A1* | 3/2007 | Aoki | H03H 9/1071 347/68 |
| 2007/0114620 | A1* | 5/2007 | Fujii | H05K 3/3436 257/414 |
| 2007/0200146 | A1* | 8/2007 | Onishi | H03H 9/0576 257/202 |
| 2007/0241447 | A1* | 10/2007 | Cheung | H01L 23/49822 257/704 |
| 2008/0073768 | A1* | 3/2008 | Shiraishi | B81B 7/007 257/684 |
| 2008/0123891 | A1* | 5/2008 | Kato | H05K 1/141 381/361 |
| 2008/0217522 | A1* | 9/2008 | Fujii | H01L 27/1446 250/216 |
| 2008/0315230 | A1* | 12/2008 | Murayama | H01L 33/486 257/98 |
| 2009/0096097 | A1* | 4/2009 | Kagaya | H01L 24/83 257/737 |
| 2009/0127638 | A1* | 5/2009 | Kilger | H01L 23/3128 257/415 |
| 2009/0236700 | A1* | 9/2009 | Moriya | H01L 23/29 257/659 |
| 2009/0308651 | A1* | 12/2009 | Abe | H05K 3/445 174/264 |
| 2010/0020469 | A1* | 1/2010 | Kurioka | H01G 4/224 361/321.1 |
| 2010/0149410 | A1* | 6/2010 | Matsuzawa | H01L 23/10 348/374 |
| 2010/0237740 | A1* | 9/2010 | Aratake | H03H 9/1021 310/312 |
| 2010/0301709 | A1* | 12/2010 | Onitsuka | H03H 9/1021 310/344 |
| 2010/0308695 | A1* | 12/2010 | Numata | H03H 3/02 310/344 |
| 2010/0308696 | A1* | 12/2010 | Numata | H03H 9/0519 310/344 |
| 2010/0308697 | A1* | 12/2010 | Aratake | H03H 9/1021 310/348 |
| 2010/0313399 | A1* | 12/2010 | Aratake | H03H 9/0542 29/25.35 |
| 2010/0327694 | A1* | 12/2010 | Omote | H03H 9/1092 310/313 R |
| 2011/0018402 | A1* | 1/2011 | Kobayashi | H03H 3/04 310/365 |
| 2011/0018403 | A1* | 1/2011 | Kobayashi | H03H 9/0542 310/370 |
| 2011/0035916 | A1* | 2/2011 | Sugiyama | H03H 9/21 29/25.35 |
| 2011/0050043 | A1* | 3/2011 | Sugiyama | H03H 3/02 310/344 |

(56) References Cited

U.S. PATENT DOCUMENTS

| | | | | |
|---|---|---|---|---|
| 2011/0050044 A1* | 3/2011 | Funabiki | .................. | H03H 3/02 310/344 |
| 2011/0050045 A1* | 3/2011 | Aratake | .............. | H03H 9/1021 310/344 |
| 2011/0062566 A1* | 3/2011 | Ito | ...................... | H01L 23/4824 257/669 |
| 2011/0074250 A1* | 3/2011 | Hashimoto | .......... | H03H 9/1071 310/340 |
| 2011/0140793 A1* | 6/2011 | Numata | .............. | H03H 9/1021 331/158 |
| 2011/0140794 A1* | 6/2011 | Fukuda | ................... | H03H 3/02 331/158 |
| 2011/0140795 A1* | 6/2011 | Yamaguchi | .............. | H03H 3/04 331/158 |
| 2011/0169584 A1* | 7/2011 | Fukuda | ................ | H03H 9/1021 331/158 |
| 2011/0174533 A1* | 7/2011 | Nagano | ................ | H03H 9/1021 174/520 |
| 2011/0181368 A1* | 7/2011 | Sugama | ................... | H03H 9/21 331/68 |
| 2011/0187472 A1* | 8/2011 | Fukuda | ................... | H03H 3/02 331/158 |
| 2011/0203084 A1* | 8/2011 | Funabiki | ................ | G04R 20/10 29/25.35 |
| 2011/0204986 A1* | 8/2011 | Funabiki | ................ | G04R 20/10 331/158 |
| 2011/0209554 A1* | 9/2011 | Miyashita | .............. | G01L 9/0073 73/724 |
| 2011/0219593 A1* | 9/2011 | Aratake | .............. | H03H 9/1021 29/25.35 |
| 2011/0220493 A1* | 9/2011 | Aratake | ................... | H03H 9/02 204/298.11 |
| 2011/0221056 A1* | 9/2011 | Miyaji | .................... | B81B 7/007 257/698 |
| 2011/0221537 A1* | 9/2011 | Aratake | .............. | H03H 9/0519 331/158 |
| 2011/0226731 A1* | 9/2011 | Funabiki | ............... | H01L 41/332 216/20 |
| 2011/0249534 A1* | 10/2011 | Fukuda | ................ | H03H 9/1021 368/47 |
| 2011/0249535 A1* | 10/2011 | Funabiki | ............. | H03H 9/1021 368/47 |
| 2011/0255378 A1* | 10/2011 | Funabiki | .............. | H03H 9/1021 368/47 |
| 2011/0261658 A1* | 10/2011 | Funabiki | .............. | H03H 9/1021 368/47 |
| 2011/0261659 A1* | 10/2011 | Fukuda | ................... | H01L 21/52 368/47 |
| 2011/0291523 A1* | 12/2011 | Sugama | ............... | H03H 9/1021 310/311 |
| 2012/0013415 A1* | 1/2012 | Tange | .................. | H03H 9/1021 331/158 |
| 2012/0039153 A1* | 2/2012 | Kobayashi | ............. | G04R 20/10 368/159 |
| 2012/0068728 A1* | 3/2012 | Kataoka | ............. | G01R 31/2887 324/756.03 |
| 2012/0079691 A1* | 4/2012 | Takano | ................ | H03H 9/1021 29/25.35 |
| 2012/0081864 A1* | 4/2012 | Sakurai | ................ | H05K 3/0052 361/753 |
| 2012/0086116 A1* | 4/2012 | Taguchi | .................. | H01L 21/50 257/698 |
| 2012/0146163 A1* | 6/2012 | Ho | ......................... | H04R 19/04 257/416 |
| 2012/0153463 A1* | 6/2012 | Maeda | .............. | H01L 23/49822 257/737 |
| 2012/0206211 A1* | 8/2012 | Kobayashi | ............. | G04R 20/10 331/158 |
| 2012/0206998 A1* | 8/2012 | Numata | ................. | G04R 20/10 368/47 |
| 2012/0243384 A1* | 9/2012 | Funabiki | ............... | G04R 20/10 368/47 |
| 2013/0038876 A1* | 2/2013 | Arakawa | ............... | B81B 7/0035 356/416 |
| 2013/0234565 A1* | 9/2013 | Aratake | ................ | H03H 9/1042 310/366 |
| 2013/0306367 A1* | 11/2013 | Hashi | .................... | H05K 3/108 174/549 |
| 2014/0000946 A1 | 1/2014 | Hosoi et al. | | |
| 2014/0045386 A1 | 2/2014 | Kimura | | |
| 2014/0049927 A1* | 2/2014 | Kamakura | ............ | C04B 37/005 361/760 |
| 2014/0092569 A1* | 4/2014 | Sakurai | ................. | H05K 1/186 361/752 |
| 2015/0223325 A1* | 8/2015 | Miyao | ............... | H01L 23/49827 174/257 |
| 2017/0294737 A1* | 10/2017 | Horchler | ............ | H01R 13/5205 |
| 2017/0350991 A1* | 12/2017 | Friedman | .............. | G01T 1/2935 |
| 2017/0373637 A1* | 12/2017 | Kondo | ................ | H03H 9/0519 |
| 2017/0373693 A1* | 12/2017 | Kondo | .................... | H03L 1/028 |
| 2018/0034442 A1* | 2/2018 | Kojo | ................ | H01L 41/316 |
| 2018/0191303 A1* | 7/2018 | Kojo | ................ | H03H 9/0595 |
| 2019/0036510 A1* | 1/2019 | Kikuchi | .................. | H01L 23/34 |
| 2019/0074427 A1* | 3/2019 | Kojo | .................. | H01L 41/047 |
| 2019/0312189 A1* | 10/2019 | Kojo | .................. | H03H 9/0547 |
| 2019/0312562 A1* | 10/2019 | Ishino | ................ | H03H 9/02102 |
| 2020/0044623 A1* | 2/2020 | Kojo | ................... | H03H 9/0595 |
| 2020/0173956 A1* | 6/2020 | Bellman | ............ | G01N 27/404 |

FOREIGN PATENT DOCUMENTS

| | | |
|---|---|---|
| CN | 104704680 A | 6/2015 |
| EP | 2581995 A2 | 4/2013 |
| JP | H02137764 U | 11/1990 |
| JP | H08162766 A | 6/1996 |
| JP | 2014011288 A | 1/2014 |
| WO | 2012144326 A1 | 10/2012 |
| WO | 2014061202 A1 | 4/2014 |

OTHER PUBLICATIONS

"PCB Mounted Vacuum Feedthroughs"; BELILOVE Company-Engineers; URL: https://heater.belilove.com/article_192_Circuit-Board-Mounted.cfm (5 pages).

International Search Report issued in corresponding International Application No. PCT/JP2018/037464, dated Dec. 25, 2018, with translation (4 pages).

* cited by examiner

VACUUM SIDE

ATMOSPHERE SIDE

SEMICONDUCTOR X-RAY IMAGE SENSOR

UPPER-LIMIT SIZE OF CURRENT INTRODUCTION TERMINAL USABLE FOR ONE SEMICONDUCTOR X-RAY IMAGE SENSOR

CURRENT INTRODUCTION TERMINAL, AND PRESSURE HOLDING APPARATUS AND X-RAY IMAGE SENSING APPARATUS THEREWITH

TECHNICAL FIELD

The present invention relates to a current introduction terminal, and also relates to a pressure holding apparatus and an X-ray image sensing apparatus provided with a current introduction terminal.

BACKGROUND ART

A synchrotron radiation facility is a supersize X-ray light source that generates X rays with high directivity and high brightness, and is used as a powerful tool for observation and analysis in a variety of fields from material science to life science to fundamental physics. Making the most of its light source performance requires an X-ray detecting apparatus with high measurement accuracy combined with fast operation. In particular, an X-ray imaging apparatus that can sense X-ray signals across a wide range coincidentally is used as a highly versatile tool, and is required to image, at a high speed beyond the limit achievable with conventional technology, radiation with an ultra-short wavelength that has passed through an analysis-target substance.

As semiconductor X-ray image sensors used on X-ray imaging apparatuses are adapted for increasingly high speeds, increasingly wide dynamic ranges, and increasingly high resolutions, the size of the image data that they output increases by extraordinary proportions. To cope with this, semiconductor X-ray image sensors are provided with increasingly large numbers of data output terminals and are designed to produce output signals at increasingly high frequencies.

In a semiconductor X-ray image sensor, an inherent or radiation-induced defect in a semiconductor crystal as the base material of the sensor produces a background signal. The intensity of the background signal increases as the sensor generates heat. A semiconductor X-ray image sensor generates more heat as it operates faster. To restrain heat generation, generally, a semiconductor X-ray image sensor is cooled down to minus several tens of degrees Celsius to improve the ratio of the real signal to the background signal. When this is done, with a view to preventing electrical short-circuiting resulting from moisture condensation on the sensor surface, it is common to hermetically contain the semiconductor X-ray image sensor inside an airtight vessel and operate it in a vacuous or dry environment. This operation requires airtight terminals (generally called current introduction terminals or feedthroughs) across which to lead the driving leads for the image sensor into the airtight vessel and to lead the data output leads out of the vacuum vessel.

One option to give an X-ray imaging apparatus a larger area and a higher resolution is, as shown in FIG. 24, to build an X-ray image sensor array by arranging a plurality of semiconductor X-ray image sensors in two dimensions. The semiconductor X-ray image sensors each operate and output data independently, and the data from them is collected and synchronized by a data analysis apparatus provided in a subsequent stage. Here, to prevent interference among the current introduction terminals, the sensor-driving/data-reading devices, and the like provided respectively in a stage subsequent to the X-ray image sensor array, the arrangement space of each of them is limited to equal to or smaller than the area of one semiconductor X-ray image sensor.

As discussed above, rapid development of X-ray imaging apparatuses with increasingly high radiation brightness has necessitated coping with the challenges mentioned above, and there is now demand for current introduction terminals that allow high-speed signal transfer combined with space-saving high-density wiring.

As mentioned above, current introduction terminals are used to introduce an electric current into an airtight chamber (vessel) from outside the chamber. In experiments and the like that involve the use of a vacuum or a high pressure, current introduction terminals are an indispensable element that permits the supply of electric power to, and the control of, devices inside the chamber.

In typical cases, there is a difference in pressure (difference in air pressure) between inside and outside the chamber, as with an atmospheric pressure of about 1 atm outside the chamber and with a vacuum or a high pressure inside the chamber. To withstand the pressure difference, the chamber is usually made of a thick metal material. Accordingly, current introduction terminals are required not to cause leakage either inside or outside the chamber and are required to be electrically insulated from the chamber made of metal.

FIG. 25 is a sectional view of conventional a current introduction terminal 900 used for a vacuum chamber. The current introduction terminal 900 in FIG. 25 is composed of a flange 901, an insulator plate 902, and wiring terminals 903. There are provided a desired number of wiring terminals 903. FIG. 25 shows, as an example, eight wiring terminals 903. The insulator plate 902 is joined to and fixed to a central part of the flange 901, and the wiring terminals 903, structured like pins, are inserted in and fixed to insertion holes provided in the insulator plate 902. The current introduction terminal 900 is, as part of a partition between a vacuum and an atmospheric pressure, coupled to the vacuum chamber, and the boundaries between the flange 901, the insulator plate 902, and the wiring terminals 903 are sealed to keep the vacuum chamber airtight.

In a first conventional method of sealing, a ceramic of alumina ($Al_2O_3$) is used as the insulator plate 902, and the ceramic and the wiring terminals 903 are brazed together so that the boundaries between them are sealed. Here, a ceramic is difficult to braze, and thus, before brazing, metallization is performed to form a metal coating on the surface of the ceramic.

In a second conventional method of sealing, Kovar-glass is used as the insulator plate 902, and Kovar, with a thermal expansion coefficient close to that of Kovar-glass, is used to form the wiring terminals 903; then the boundaries between the insulator plate 902 and the wiring terminals 903 are fused and sealed. Compared with the first conventional method, the second conventional method offers weaker mechanical strength and weaker thermal adhesion (there is concern for cracks in response to a pressure or a temperature variation).

Current introduction terminals structured like pins are disclosed also in Non-Patent Document 1 identified below.

On the other hand, Patent Document 1 discloses feedthroughs in which airtight terminals are formed by injecting electrically conductive paste into via holes provided in a ceramic printed board. Patent Document 1 teaches, "As indicated at 252 of FIG. 2B, one or more via holes may be formed into the green ceramic sheet", and further teaches, "Thereafter, a conductive paste may fill in the via holes, as indicated at 254 of FIG. 2B" (see Patent Document 1, latter part of column 4).

CITATION LIST

Patent Literature

Patent Document 1: U.S. Pat. No. 9,591,770, the specification.

Non-Patent Literature

Non-Patent Document 1: "PCB Mounted Epoxy Vacuum Feedthroughs", (on-line), BELILOVE Company-Engineers, (browsed on Apr. 19, 2017), on the Internet <URL:http://heater.belilove.com/article_192_Circuit-Board-Mounted.cfm>.

SUMMARY OF INVENTION

Technical Problem

The method employing a ceramic printed board requires the steps of providing via holes and wiring patterns on a plurality of ceramic green sheets, stacking the sheets together until the stack has a predetermined thickness, and then sintering the stack; this is technically extremely difficult and incurs extremely high costs, making mass-production difficult. This hinders spread into consumer products. For example, application to a high-resolution X-ray imaging apparatus, which requires a large number of current introduction terminals, is not practical. Moreover, as an electrical property of a ceramic, it has a high relative permittivity Er, and is disadvantageous, as compared with a board made of a resin material, from the perspective of adapting to signals with increasingly high frequencies; for example, its application to a fast X-ray imaging apparatus results in insufficient high-frequency characteristics.

Thus, the conventional terminal structures mentioned above do not meet the specifications required in an X-ray imaging apparatus that needs several tens of current introduction terminals across which to lead out, within a limited space, the wide-band signals from high-speed, high-resolution X-ray image sensors at a high frequency of the order of Gbps. Specifically, for example, reading image signals at a frame rate of 20.88 kHz from an image sensor array with 21.23 million pixels requires a technology that permits 480 terminals adapted for high-speed signals of 3 Gbps to be lead out hermetically with an extremely small pitch of 0.5 mm in each of 45 mm by 45 mm square areas. With the conventional methods, it is difficult to obtain current introduction terminals that can be mass-produced at a high yield rate (the specific values mentioned are merely illustrative, and the present invention is not limited to arrangements that fulfill those values).

Irrespective of which of the first and second conventional methods is used, the pitch of wiring terminals 903 (the interval between adjacent wiring terminals 903) is about 1.25 mm or 2.5 mm at the minimum, and higher wiring density is difficult to attain. The degree of insulation between adjacent wiring terminals 903, the mechanical strength of wiring terminals 903, and the like determine the limit of the pitch.

Non-Patent Document 1 is considered to disclose a structure where a printed circuit board is used as an insulator plate 902 and the printed circuit board is penetrated by pin terminals as wiring terminals 903. Also with the method of Non-Patent Document 1, the pitch of pin terminals is considered to have a lower limit similar to that in the first or second conventional method.

Transferring high-speed signals with a band width over Gbps with the first or second conventional method or the method of Non-Patent Document 1 requires, for impedance matching, current introduction terminals formed in the shape of coaxial cables. In that case, each wiring requires a space of about 10 mm in outer diameter (diameter).

For the reasons given above, with current introduction terminals according to the conventional technologies, it is impossible to simultaneously achieve high-speed signal transfer and space-saving high-density wiring. To achieve that, current introduction terminals need to be built with a high-speed print circuit board having impedance-matched fine wirings. The material of the printed circuit board is a resin or a ceramic. In general, a resin material is preferred as the board material from the perspectives of a low relative permittivity $\varepsilon_r$, good high-frequency characteristics, the micro-wiring limit, and mass-producibility, except in special applications.

One conceivable method of leading wiring terminals to the other side of a board is doing so using penetrating through-hole vias, which is one of micro-wiring technologies for multi-layer boards. Patent Document 1 proposes a method using a ceramic board where via-openings are filled with silver paste and are then sintered for airtight sealing.

This method, however, cannot be applied to a resin material board because it melts when sintered. As has been discussed above, as compared with a ceramic board, a resin material board has great advantages from the perspectives of high-frequency characteristics, the micro-wiring limit, and mass-producibility, but is disadvantageous in not being applicable to current introduction terminals for the lack of a highly reliable method of hermetically sealing via-openings. Although, for the sake of concrete description, problems and the like associated with conventional current introduction terminals have been discussed in connection with X-ray imaging apparatuses, similar problems and the like are encountered not only in X-ray imaging apparatuses but in various apparatuses that require current introduction terminals.

An object of the present invention is to provide a current introduction terminal that contributes to faster and higher-density transfer of signals from a component (e.g., a high-speed, high-resolution image sensor) arranged inside an airtight chamber (e.g., a vacuum chamber), and to provide a pressure holding apparatus and an X-ray image sensing apparatus provided with such a current introduction terminal.

Solution to Problem

A current introduction terminal according to a first aspect of the present invention is a current introduction terminal for introducing an electric current into a chamber while keeping the chamber airtight, and includes: an insulating board of resin that has, as two faces that are opposite each other, a first face to be placed in the environment outside the chamber and a second face to be placed in the environment inside the chamber and that separates from each other the environment outside the chamber and the environment inside the chamber. A plurality of through via holes are formed in the insulating board to penetrate the insulating board between the first and second faces, and the through via holes have their respective hole parts filled by a predetermined filling material. On each of the first and second faces, a plurality of pads of metal that respectively cover the hole parts of the through via holes are formed so as to allow transfer of electric power or an electric signal between the first and second faces while restraining passage of fluid between the first and second faces through the hole parts.

An air pressure holding apparatus according to a second aspect of the present invention is an air pressure holding apparatus formed by coupling together a plurality of components including a chamber and a current introduction terminal so as to keep an air pressure inside the chamber different from an air pressure outside the chamber, and includes, as the current introduction terminal, the current introduction terminal according to the first aspect.

An X-ray image sensing apparatus according to a third aspect of the present invention is an X-ray image sensing apparatus that includes: a plurality of X-ray image sensors disposed inside a chamber the air pressure inside which is kept lower than in the outer space; a signal processing circuit for the X-ray image sensors that is disposed outside the chamber; and the current introduction terminal according to the first aspect as a current introduction terminal for making the plurality of X-ray image sensors conduct to the signal processing circuit while keeping the chamber airtight.

Advantageous Effects of Invention

According to the present invention, it is possible to provide a current introduction terminal that contributes to faster and higher-density transfer of signals from a component (e.g., a high-speed, high-resolution image sensor) arranged inside an airtight chamber (e.g., a vacuum chamber), and to provide a pressure holding apparatus and an X-ray imaging apparatus provided with such a current introduction terminal.

DESCRIPTION OF EMBODIMENTS

Hereinafter, examples embodying the present invention will be described specifically with reference to the accompanying drawings. Among the diagrams referred to in the course, the same parts are identified by the same reference signs, and in principle no overlapping description of the same parts will be repeated. In the present description, for the sake of simple description, symbols and other designations referring to information, signals, physical quantities, components, and the like are occasionally used with the names of the corresponding information, signals, physical quantities, components, and the like omitted or abbreviated.

<<Basic Embodiment>>

Figure 1:
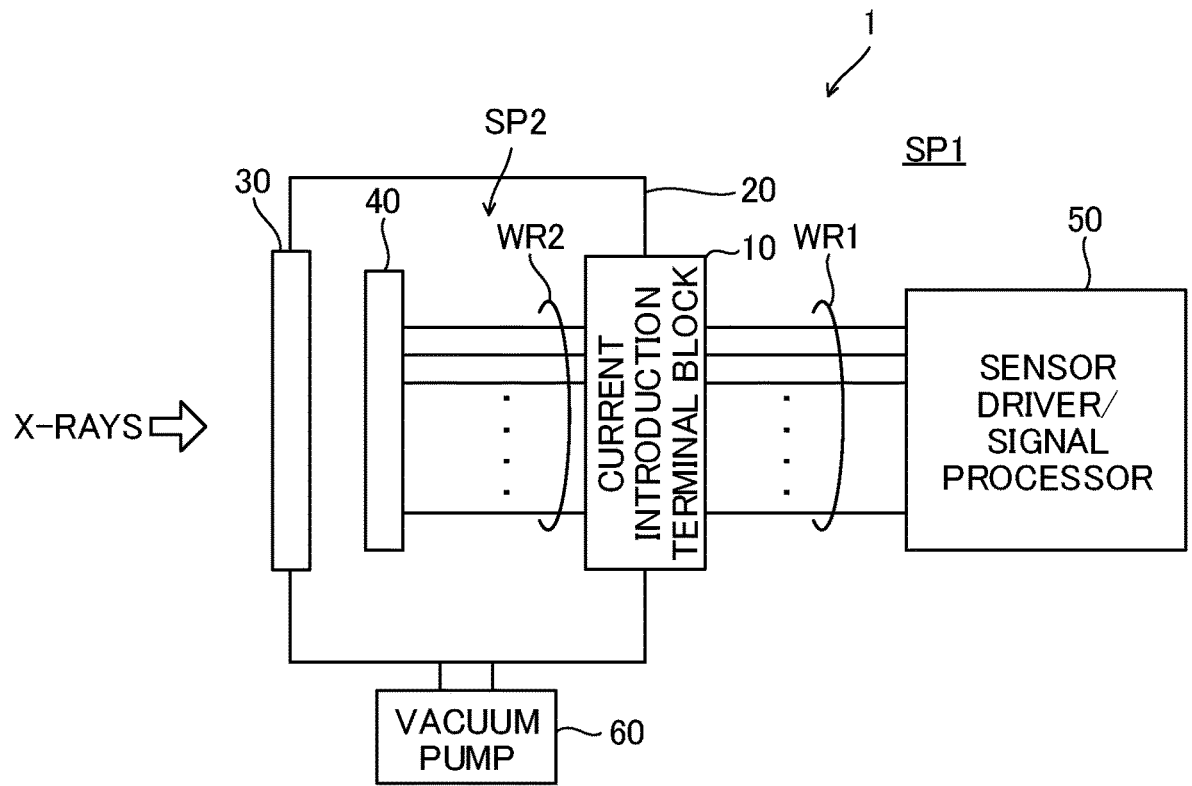
FIG. 1 is a schematic overall configuration diagram of an X-ray imaging apparatus according to a basic embodiment of the present invention.

First, a basic embodiment of the present invention will be described. FIG. 1 is a schematic overall configuration diagram of an X-ray imaging apparatus 1 according to the basic embodiment. The X-ray imaging apparatus 1 includes a current introduction terminal block 10, a chamber 20, an X-ray transmitting window 30, an X-ray image sensor 40, a sensor driver/signal processor 50, a vacuum pump 60, and wiring bunches WR1 and WR2. The X-ray imaging apparatus 1 can perform X-ray imaging of an unillustrated imaging target.

The chamber 20 is a vessel that has a cavity inside, and is made of metal such as stainless steel. In the present description, "chamber" is synonymous with "vessel", and is therefore any chamber mentioned can be read as a vessel. For the sake of convenience, the space that the cavity formed inside the chamber 20 constitutes will be referred to as the space SP2. On the other hand, the space outside the chamber 20 will be referred to as the space SP1. The X-ray image sensor 40 is arranged inside the space SP2. The chamber 20 has, for example, a cylindrical shape, with the X-ray transmitting window 30 provided in one base of the cylinder and the current introduction terminal block 10 provided in the other base of the cylinder.

An optical image of an unillustrated imaging target including structural information on the imaging target is incident through the X-ray transmitting window 30 on the X-ray image sensor 40, and is imaged on the imaging surface of the X-ray image sensor 40. The X-ray image sensor 40 is, for example, a semiconductor sensor that is formed with a semiconductor material and that can sense X-rays. The X-ray image sensor 40 can, in response to a sensor control signal fed to it, output an imaging signal representing the optical image imaged on the imaging surface.

The sensor driver/signal processor 50 feeds driving electric power for the X-ray image sensor 40 via the current introduction terminal block 10. The sensor driver/signal processor 50 also feeds a sensor control signal for driving and controlling the X-ray image sensor 40 via the current introduction terminal block 10 to the X-ray image sensor 40, and thereby acquires the above-mentioned imaging signal from the X-ray image sensor 40 via the current introduction terminal block 10. The sensor driver/signal processor 50 subjects the acquired imaging signal to predetermined signal processing to produce an X-ray image of the imaging target.

The vacuum pump 60 discharges gas out of the cavity in the chamber 20 to keep a vacuum inside the space SP2. To keep the space SP2 airtight (in other words, to restrain passage of fluid between inside and outside the chamber 20), the current introduction terminal block 10, the X-ray transmitting window 30, and the vacuum pump 60 are joined to the chamber 20 by use of metal gaskets, rubber O-rings, or the like. Here, "vacuum" covers any air pressure lower than an air pressure of 1 atm, and denotes, for example, an air pressure of $1 \times 10^{-5}$ to $1 \times 10^{-10}$ Torr. The air pressure outside the chamber 20, including where the sensor driver/signal processor 50 is arranged, that is, the air pressure in the space SP1 is higher than that inside the space SP2, and is here assumed to be 1 atm. The air pressure in the space SP1 will sometimes be referred to as the atmospheric pressure.

The current introduction terminal block 10 is a unit that is used in a partition separating between inside and outside the chamber 20 (i.e., separating the spaces SP2 and SP1 from each other) and that introduces electric currents (in other words, feeds electric power or transfers electric signals) from the space SP1 to the space SP2 while keeping the chamber 20 airtight (i.e., while keeping a vacuum inside the space SP2 in the chamber 20). The current introduction terminal block 10 is what is generally called a current introduction terminal or a feedthrough. The current introduction terminal block 10 may be a unit that introduces (in other words, feeds electric power or transfer electric signals) electric currents from the space SP2 to the space SP1, and electric currents may be introduced bidirectionally between the spaces SP1 and SP2. In one example of practical application, from the sensor driver/signal processor 50 in the space SP1 to the X-ray image sensor 40 in the space SP2, driving electric power is supplied and a sensor control signal is transmitted to achieve current introduction, and from the X-ray image sensor 40 in the space SP2 to the sensor driver/signal processor 50 in the space SP1, an imaging signal is transmitted to achieve current introduction.

The sensor driver/signal processor 50 and the current introduction terminal block 10 are, in the space SP1, connected together by the wiring bunch WR1, which comprises a plurality of wirings. The X-ray image sensor 40 and the current introduction terminal block 10 are, in the space SP2, connected together by the wiring bunch WR2, which comprises a plurality of wirings. The wirings constituting the wiring bunch WR1 are each electrically connected via the current introduction terminal block 10 to one of the wirings constituting the wiring bunch WR2. That is, with the current introduction terminal block 10, while the chamber 20 is kept airtight, conduction between the X-ray image sensor 40 and the sensor driver/signal processor 50 is secured.

Figure 2:
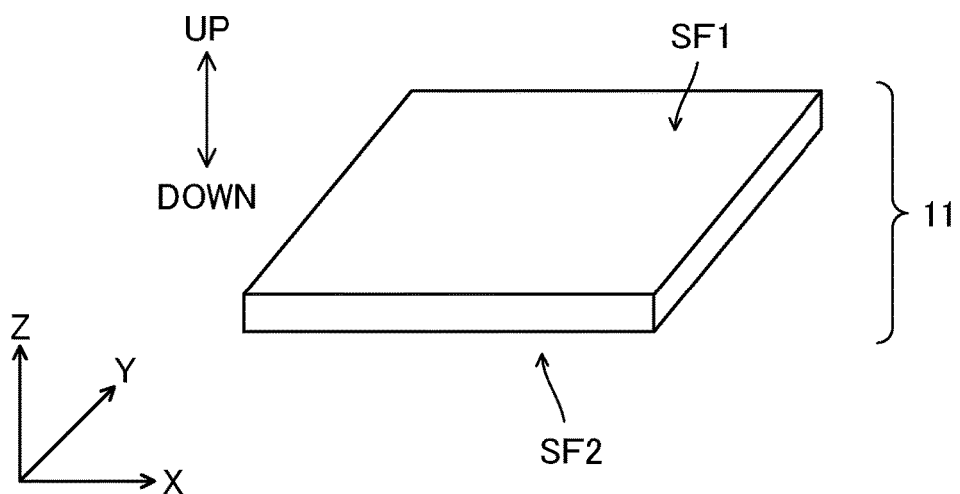
FIG. 2 is a perspective view showing, in a simplified form, a current introduction board constituting a current introduction terminal block.

FIG. 2 is a perspective view showing, in a simplified form, a current introduction board 11, which is a principal component of the current introduction terminal block 10. The current introduction board 11 can have, formed in or on it, through holes, patterns, holes, and can have, mounted on it, components such as a connector; these elements, however, are all omitted from illustration in FIG. 2. The current introduction board 11 is a printed board (i.e., insulating board) made of an electrically insulating material, and more particularly is one that is classified as a rigid board made of an inflexible electrically insulating material. As the material for the current introduction board 11, various kinds of material can be used; for example, a glass epoxy board (i.e., a plate-form printed board obtained by applying thermal curing to a material resulting from impregnating a cloth of glass fiber with epoxy resin), a glass composite board, or a ceramic board can be used as the current introduction board 11. It is however preferable that an insulating board made of resin be used to form the current introduction board 11. As an insulating board made of resin, a glass epoxy board is preferred; for another example, an insulating board formed of polyphenylene ether resin can be used as the current introduction board 11.

The current introduction board 11 has the shape of a plate, and has two faces SF1 and SF2 that are opposite each other. The current introduction board 11 can be said to have substantially the shape of a rectangular parallelepiped; of the six faces forming the rectangular parallelepiped, the two faces that have the largest, equal area are the faces SF1 and SF2. This, however, is not meant to limit the shape of the current introduction board 11, which may instead have the shape of a disc or the like. The distance between the faces SF1 and SF2 is the thickness of the current introduction board 11. Basically, the face SF1 is contiguous with the space SP1, and the face SF2 is contiguous with the space SP2. That is, when the X-ray imaging apparatus 1 is built by use of the current introduction terminal block 10 including the current introduction board 11, basically, the face SF1 is located in the environment outside the chamber 20 (in an environment of the atmospheric pressure), and the face SF2 is located in the environment inside the chamber 20 (in an environment of a vacuum) (exceptions will be dealt with later). The current introduction board 11 thus functions as part of the partition that separates between the environment outside the chamber 20 and the environment inside the chamber 20.

For the sake of concrete and clear description, assume X, Y, and Z axes that are perpendicular to each other in real space. The face SF1 (and hence the face SF2 too) of the current introduction board 11 is assumed to be parallel to the X and Y axes. The plane parallel to the X and Y axes will be called the XY plane. For the sake of convenience in description, the direction pointing from the face SF2 to the face SF1 is assumed to be the upward direction. Thus, the top-bottom (up-down) axis is parallel to the X axis. The top-bottom axis that is assumed here for the sake of convenience in description does not necessarily coincide with the top-bottom axis (i.e., the vertical direction) in real space, but may instead coincide with, for example, the horizontal direction in real space.

Figure 3:
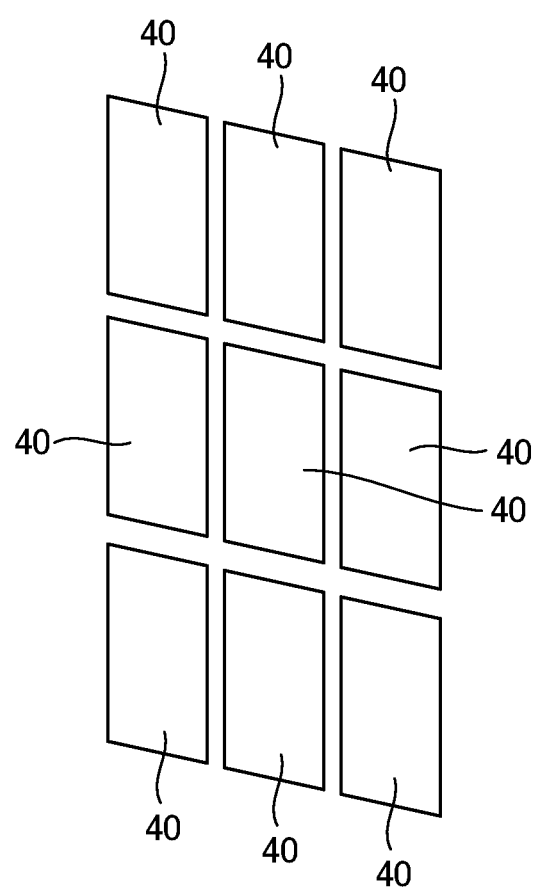
FIG. 3 is a diagram showing an X-ray image sensor array according to a first embodiment of the present invention.

As shown in FIG. 3, a plurality of X-ray image sensors 40 can be arrayed in two dimensions to form a large-area X-ray image sensor array. That is, although only one X-ray image sensor 40 is shown in FIG. 1, a plurality of X-ray image sensors 40 arrayed in two dimensions may be arranged in the space SP2 in the chamber 20. In that case, one current introduction board 11 may be provided in the current introduction terminal block 10 for each X-ray image sensor 40, in which case as many current introduction boards 11 as the number of X-ray image sensors 40 are provided in the current introduction terminal block 10. Instead, one current introduction board 11 may be allocated to two or more X-ray image sensors 40; or only one current introduction board 11 may be provided in the current introduction terminal block 10 so that, via that one current introduction board 11, conduction is secured between all the X-ray image sensors 40 forming the X-ray image sensor array and the sensor driver/signal processor 50. In any case, the current introduction terminal block 10 configured to include one or more current introduction boards 11 functions, while keeping the chamber 20 airtight, to secure conduction between the plurality of X-ray image sensors 40 arranged inside the chamber 20 and the sensor driver/signal processor 50 including signal processing circuits corresponding to those X-ray image sensors 40. The X-ray imaging apparatus 1 may be provided with only one X-ray image sensor 40.

In a case where the X-ray imaging apparatus 1 is provided with a plurality of X-ray image sensors 40, the X-ray image sensor 40 in the following description is to be understood to refer to each or one of the plurality of X-ray image sensors 40. While specific structures of the current introduction board and the like will be described below with attention paid to one current introduction board 11, in a case where the current introduction terminal block 10 is provided with a plurality of current introduction boards 11, the description applies to each of the current introduction boards 11.

A few embodiments based on the basic embodiment will be presented below. Unless otherwise stated, the description of the basic embodiment applies to the following embodiments. For any feature of any of the following embodiments that contradicts what has been described in connection with the basic embodiment, the description of that feature given in connection with that embodiment prevails. Two or more of the following embodiments can be combined together.

First Embodiment

A first embodiment of the present invention will be described.

Figure 4A:
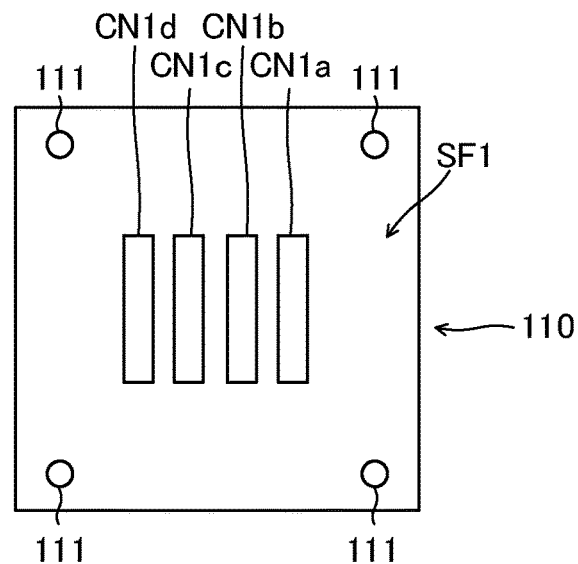
FIGS. 4A to 4C are diagrams showing a current introduction board according to the first embodiment of the present invention.
Figure 4B:
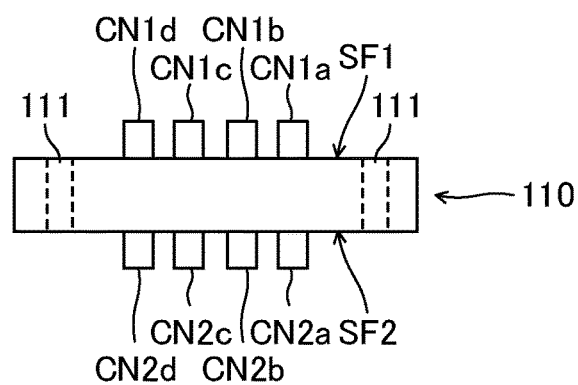
Figure 4C:
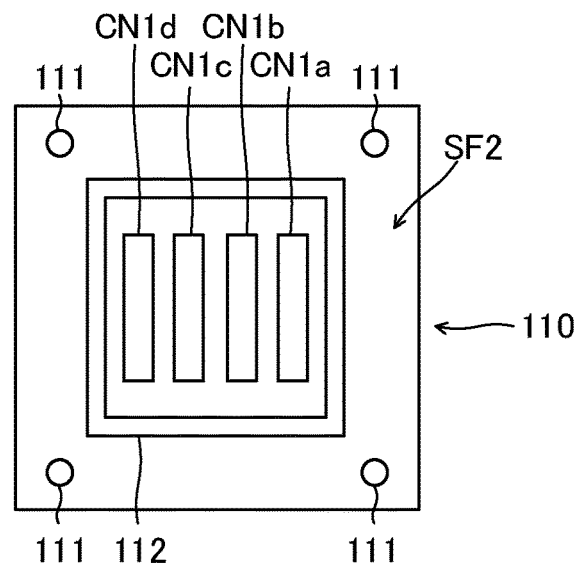

FIGS. 4A to 4C are exterior views of a current introduction board 110 according to a first embodiment. FIG. 4A is a plan view of the current introduction board 110 as seen from the face SF1 side, FIG. 4B is a side view of the current introduction board 110, and FIG. 4C is a plan view of the current introduction board 110 as seen from the face SF2 side. In the first embodiment, the current introduction board 110 is used as the current introduction board 11 provided in the current introduction terminal block 10 in FIG. 1. In the first embodiment, the faces SF1 and SF2 refer to the faces SF1 and SF2 on the current introduction board 110.

The current introduction board 110 is a double-sided board formed of a glass epoxy board, and the face SF1 (and hence the face SF2) has a substantially rectangular shape (which can be a square shape). Four bolt holes 111 each in the shape of a cylinder penetrating between the faces SF1 and SF2 are provided in the four corners of the face SF1 (and hence the face SF2).

On the face SF1 of the current introduction board 110, connectors CN1a to CN1d are mounted in a row; on the face SF2 of the current introduction board 110, connectors CN2a to CN2d are mounted in a row. The row direction of the connectors CN1a to CN1d and the row direction of the connectors CN2a to CN2d coincide. The connectors CN1a to CN1d and CN2a to CN2d are each a surface-mount connector that includes a case formed of an electrically insulating material such as resin or ceramic and a plurality of metal terminals protruding from the case. The connectors CN2a to CN2d are amounted respectively at positions opposite the connectors CN1a to CN1d. That is, on the XY plane, the arrangement positions of the connectors CN2a to CN2d coincide with the arrangement positions of the connectors CN1a to CN1d respectively. Accordingly, each of the connectors CN1a to CN1d forms a pair ("connector pair") with a corresponding one of the connectors CN2a to CN2d, respectively. On the face SF2, at a position surrounding the mounting positions of the connectors CN2a to CN2d, a ring-shaped gold-plated surface 112 is formed so as to be exposed (the functions of the gold-plated surface 112 will be described later).

Figure 5:
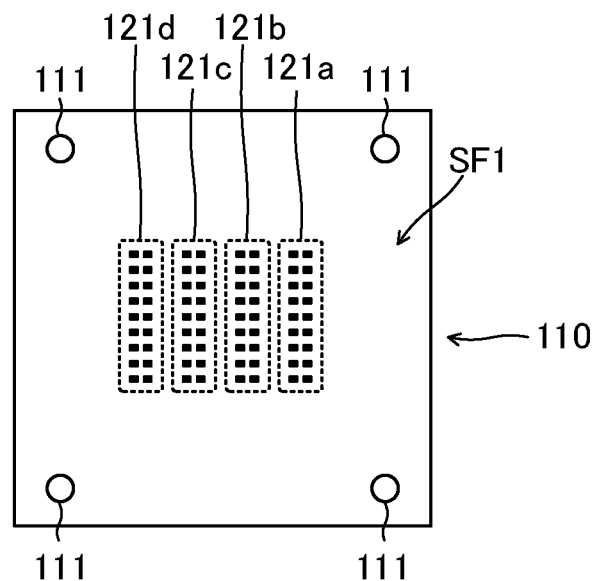
FIG. 5 is a plan view of the current introduction board before connectors are mounted on it as seen from one side in connection with the first embodiment of the present invention.

FIG. 5 is a plan view of the current introduction board 110 as seen from the face SF1 side before the connectors CN1a to CN1d are mounted on it. On the face SF1, a large number of pads, which are pieces of metal foil for soldering, are formed. The larger number of pads on the face SF1 are insulated from each other (though some of them may conduct to each other). The large number of pads on the face SF1 are divided into pad groups 121a to 121d, and each of the pad groups 121a to 121d includes a plurality of pads. Solder paste is applied to the plurality of pads in the pad group 121a, and then, with the plurality of metal terminals of the connector CN1a placed on the plurality of pads, the current introduction board 110 is heated; in this way, on the face SF1, conduction is secured between the plurality of pads in the pad group 121a and the plurality of metal terminals in the connector CN1a. Likewise, on the face SF1, conduction is secured between the plurality of pads in the pad group 121b and the plurality of metal terminals in the connector CN1b, conduction is secured between the plurality of pads in the pad group 121c and the plurality of metal terminals in the connector CN1c, and conduction is secured between the plurality of pads in the pad group 121d and the plurality of metal terminals in the connector CN1d.

Figure 6:
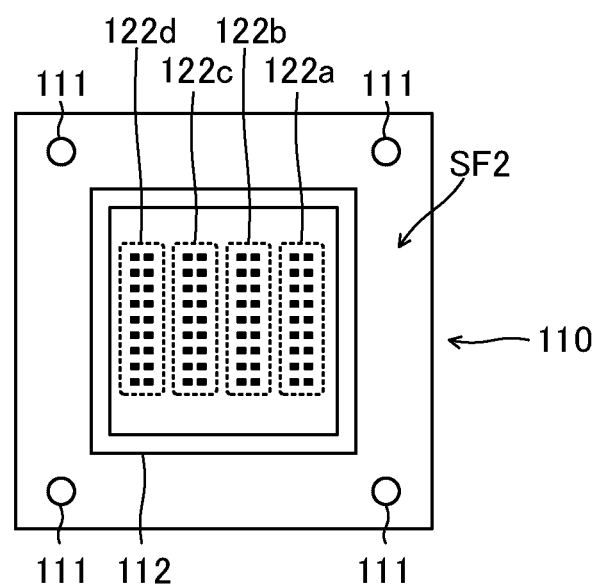
FIG. 6 is a plan view of the current introduction board before connectors are mounted on it as seen from the other side in connection with the first embodiment of the present invention.

FIG. 6 is a plan view of the current introduction board 110 as seen from the face SF2 side before the connectors CN2a to CN2d are mounted on it. On the face SF2, a large number of pads, which are pieces of metal foil for soldering, are formed. The larger number of pads on the face SF2 are insulated from each other (though some of them may conduct to each other). The large number of pads on the face SF2 are divided into pad groups 122a to 122d, and each of the pad groups 122a to 122d includes a plurality of pads. Solder paste is applied to the plurality of pads in the pad group 122a, and then, with the plurality of metal terminals of the connector CN2a placed on the plurality of pads, the current introduction board 110 is heated; in this way, on the face SF2, conduction is secured between the plurality of pads in the pad group 122a and the plurality of metal terminals in the connector CN2a. Likewise, on the face SF2, conduction is secured between the plurality of pads in the pad group 122b and the plurality of metal terminals in the connector CN2b, conduction is secured between the plurality of pads in the pad group 122c and the plurality of metal terminals in the connector CN2c, and conduction is secured between the plurality of pads in the pad group 122d and the plurality of metal terminals in the connector CN2d.

Any pad formed on the face SF1 will be referred to by the reference sign PD1, and any pad formed on the face SF2 will be referred to by the reference sign PD2.

Figure 7A:
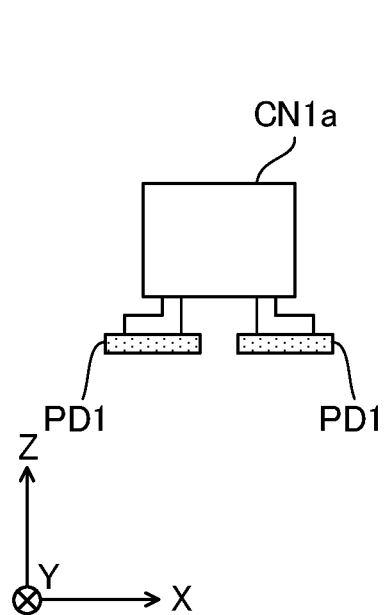
FIGS. 7A and 7B are diagrams showing connection between a plurality of pads and a plurality of metal terminals of a connector (connection on one side of the current introduction board) in connection with the first embodiment of the present invention.
Figure 7B:
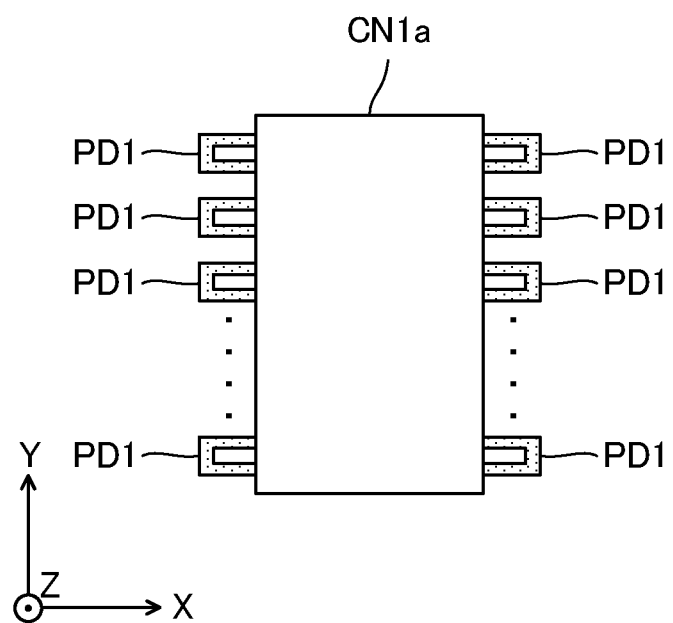

FIGS. 7A and 7B show the connection between the plurality of pads PD1 included in the pad group 121a (see also FIG. 5) and the plurality of metal terminals in the connector CN1a. In FIGS. 7A and 7B, dot-hatched areas represents pads PD1. Each pad PD1 in the pad group 121a is soldered to one metal terminal in the connector CN1a to conduct to it, and functions as a connecting surface with the metal terminal to which it is supposed to conduct. Similar description applies to conduction between the pads PD1 in the pad groups 121b to 121d and the metal terminals in the connectors CN1b to CN1d. Mutually adjacent pads PD1 are insulated from each other, and the pitch between pads PD1 may be any pitch, the pitch being, for example, 0.2 mm or 0.25 mm. The pitch between pads PD1 denotes, when attention is payed to a first pad PD1 and a second pad PD1 that are adjacent to each other, the distance between the central position of the first pad PD1 and the central position of the second pad PD1. On the face SF1, the pads PD1 are arranged in a manner spread in two dimensions; the pitch between pads PD1 in the first direction and the pitch between pads PD1 in the second direction different from (e.g., perpendicular to) the first direction may be equal or different. That is, although, in the example in FIGS. 7A and 7B, it is assumed that the pitch between pads PD1 along the Y axis is relatively short (e.g., 0.2 mm or 0.25 mm) and that the pitch between pads PD1 along the X axis is relatively long, the former pitch and the latter pitch may be equal.

In the example in FIGS. 7A and 7B, on the XY plane, the metal terminals protrude from the case of the connector CN1a. Instead, it is possible to use a connector CN1a in which the entire metal terminals are accommodated between the case of the connector CN1a and the face SF1 of the current introduction board 110. Similar description applies to the connectors CN1b to CN1d.

Figure 8A:
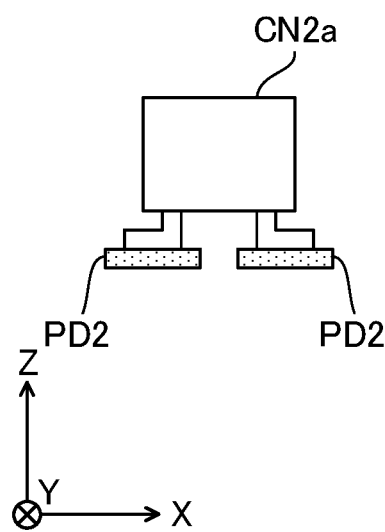
FIGS. 8A and 8B are diagrams showing connection between a plurality of pads and a plurality of metal terminals of a connector (connection the on other side of the current introduction board) in connection with the first embodiment of the present invention.
Figure 8B:
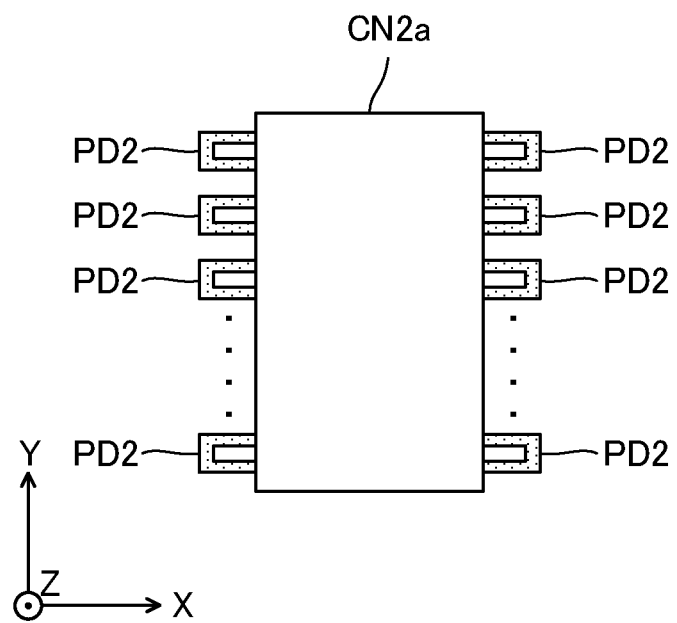

FIGS. 8A and 8B show the connection between the plurality of pads PD2 included in the pad group 122a (see also FIG. 5) and the plurality of metal terminals in the connector CN2a. In FIGS. 8A and 8B, dot-hatched areas represents pads PD2. Each pad PD2 in the pad group 122a is soldered to one metal terminal in the connector CN2a to conduct to it, and functions as a connecting surface with the metal terminal to which it is supposed to conduct. Similar description applies to conduction between the PD2s in the pad groups 122b to 122d and the metal terminals in the connectors CN2b to CN2d. Mutually adjacent pads PD2 are insulated from each other, and the pitch between pads PD2 may be any pitch, the pitch being, for example, 0.2 mm or 0.25 mm. The pitch between pads PD2 denotes, when attention is payed to a first pad PD2 and a second pad PD2 that are adjacent to each other, the distance between the central position of the first pad PD2 and the central position of the second pad PD2. On the face SF2, the pads PD2 are arranged in a manner spread in two dimensions; the pitch between pads PD2 in the first direction and the pitch between pads PD2 in the second direction different from (e.g., perpendicular to) the first direction may be equal or different. That is, although, in the example in FIGS. 8A and 8B, it is assumed that the pitch between pads PD2 along the Y axis is relatively short (e.g., 0.2 mm or 0.25 mm) and that the pitch between pads PD2 along the X axis is relatively long, the former pitch and the latter pitch may be equal. Given, however, that the current introduction board 110 is so structured that one pad PD1 and the one pad PD2 that is supposed to conduct to that pad PD1 are aligned on a straight line in the direction normal to the faces SF1 and SF2, the pitch between pads PD1 and the pitch between pads PD2 coincide in each of the X-axis and Y-axis directions.

In the example in FIGS. 8A and 8B, on the XY plane, the metal terminals protrude from the case of the connector CN2a. Instead, it is possible to use a connector CN2a in which the entire metal terminals are accommodated between the case of the connector CN2a and the face SF2 of the current introduction board 110. Similar description applies to the connectors CN2b to CN2d.

Figure 9:
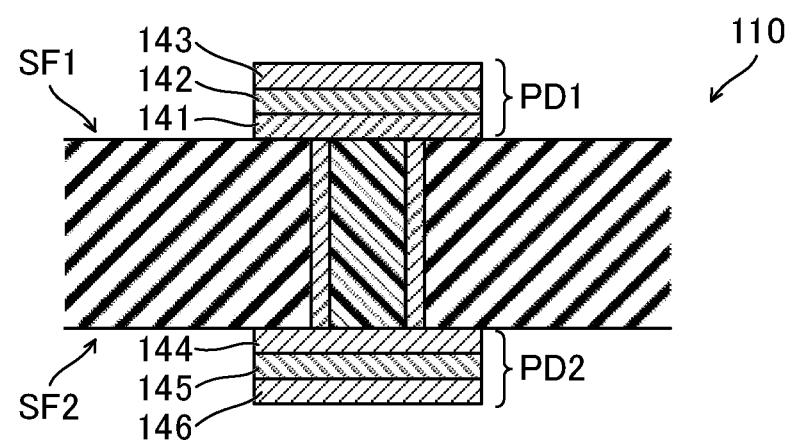
FIG. 9 is a part sectional view of the current introduction board with attention paid to a pair of pads conducting to each other in connection with the first embodiment of the present invention.
Figure 10:
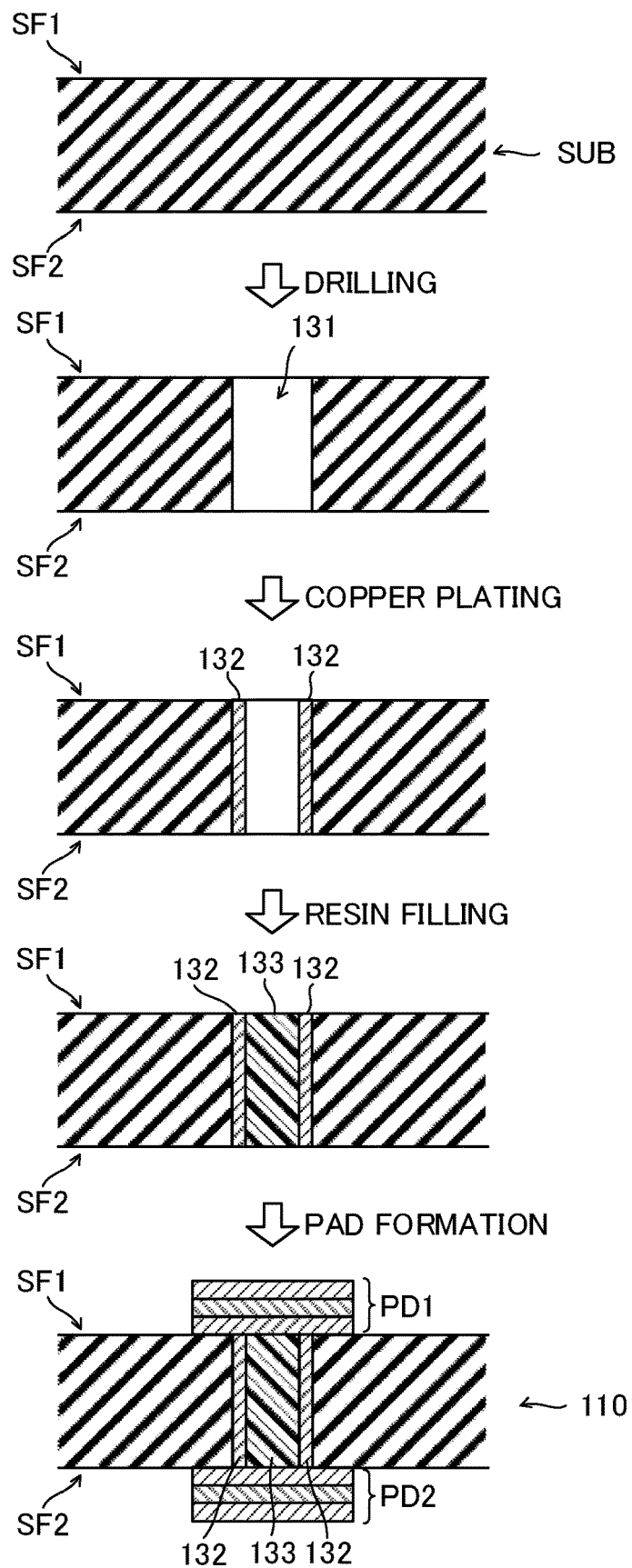
FIG. 10 is a diagram illustrating a procedure for manufacturing the current introduction board in connection with the first embodiment of the present invention.

FIG. 9 is a part sectional view of the current introduction board 110 with attention paid to one pad PD1 on the face SF1 and the one pad PD2 on the face SF2 that is supposed to conduct to that pad PD1. FIG. 10 is a diagram showing a procedure for manufacturing the current introduction board 110 including the pads PD1 and PD2 from an initial board SUB that is going to be formed into the current introduction board 110. With attention paid to the one pair of pads PD1 and PD2, the manufacturing procedure of the current introduction board 110 will be described.

First, in the board SUB still flat with no wirings or holes formed on or in it, a circular hole 131 (a hole with a circular cross-section) that penetrates it between the faces SF1 and SF2 is formed along the direction normal to the faces SF1 and SF2 by use of a drill. Then, by plating, a copper film 132 is formed over the entire inner wall of the hole 131. Subsequently, the space inside the hole 131 except the part coated by the copper film 132 is filled with a predetermined resin material 133 (e.g., epoxy resin). Thereafter, on each of the faces SF1 and SF2, plating for forming a copper film, plating for forming a nickel film, and plating for forming a gold film are performed sequentially; then, by well-known masking and etching, unnecessary parts of the metal films (copper film, nickel film, and gold film) are removed from the faces SF1 and SF2. In this way, a pad PD1 is formed on the face SF1, and a pad PD2 is formed on the face SF2.

As shown in FIG. 9, the pad PD1 is formed of a copper film 141, a nickel film 142, and a gold film 143 which conduct to each other. The copper film 141 bonds directly to the copper film 132. Of the copper film 141, the nickel film 142, and the gold film 143, the gold film 143 is located the farthest from the copper film 132. The nickel film 142 is located between the copper film 141 and the gold film 143. Likewise, the pad PD2 is formed of a copper film 144, a nickel film 145, and a gold film 146 which conduct to each other. The copper film 144 bonds directly to the copper film 132. Of the copper film 144, the nickel film 145, and the gold film 146, the gold film 146 is located the farthest from the copper film 132. The nickel film 145 is located between the copper film 144 and the gold film 146.

The hole 131 and the copper film 132 form a through via hole. Thus, put in other words, first the hole part of the through via hole (i.e., the space inside the hole 131 except the part coated by the copper film 132) is filled with the resin material 133, and then the pads PD1 and PD2 are formed to cover the entire hole part from opposite sides. The metal terminal in the connector (one of the connectors CN1a to CN1d) that is supposed to conduct to the pad PD1 is bonded, by soldering, directly to the pad PD1, and the metal terminal in the connector (one of the connectors CN2a to CN2d) that is supposed to conduct to the pad PD2 is bonded, by soldering, directly to the pad PD2. A through via hole is generally also called a through hole or a through-hole via. On the face SF1 (on a plane parallel to the face SF1), the pad PD1 is larger than the hole part of the through via hole and covers the entire hole part without leaving any gap; on the face SF2 (on a plane parallel to the face SF2), the pad PD2 is larger than the hole part of the through via hole and covers the entire hole part without leaving any gap. Thus, in the current introduction board 110, there is no or negligibly little passage of gas between the spaces SP1 and SP2 via the through via hole.

A pad PD1, a through via hole, and a pad PD2 that conduct to each other constitute a unit current introducer, and a plurality of such unit current introducers are formed on the current introduction board 110; thus a plurality of wirings constituting the wiring bunch WR1 are, via the connectors (CN1a to CN1d) on the face SF1, the plurality of unit current introducers, and the connectors (CN2a to CN2d) on the face SF2, connected to, so as to conduct to, the plurality of wirings constituting the wiring bunch WR2.

In the current introduction board 110, the diameter (see FIG. 10) of the hole 131 and the sizes and the shapes of the pads PD1 and PD2 are designed with consideration given to the pitch between adjacent pads PD1 and the pitch between adjacent pads PD2 so that insulation is secured between adjacent pads PD1 and between adjacent pads PD2.

Figure 11:
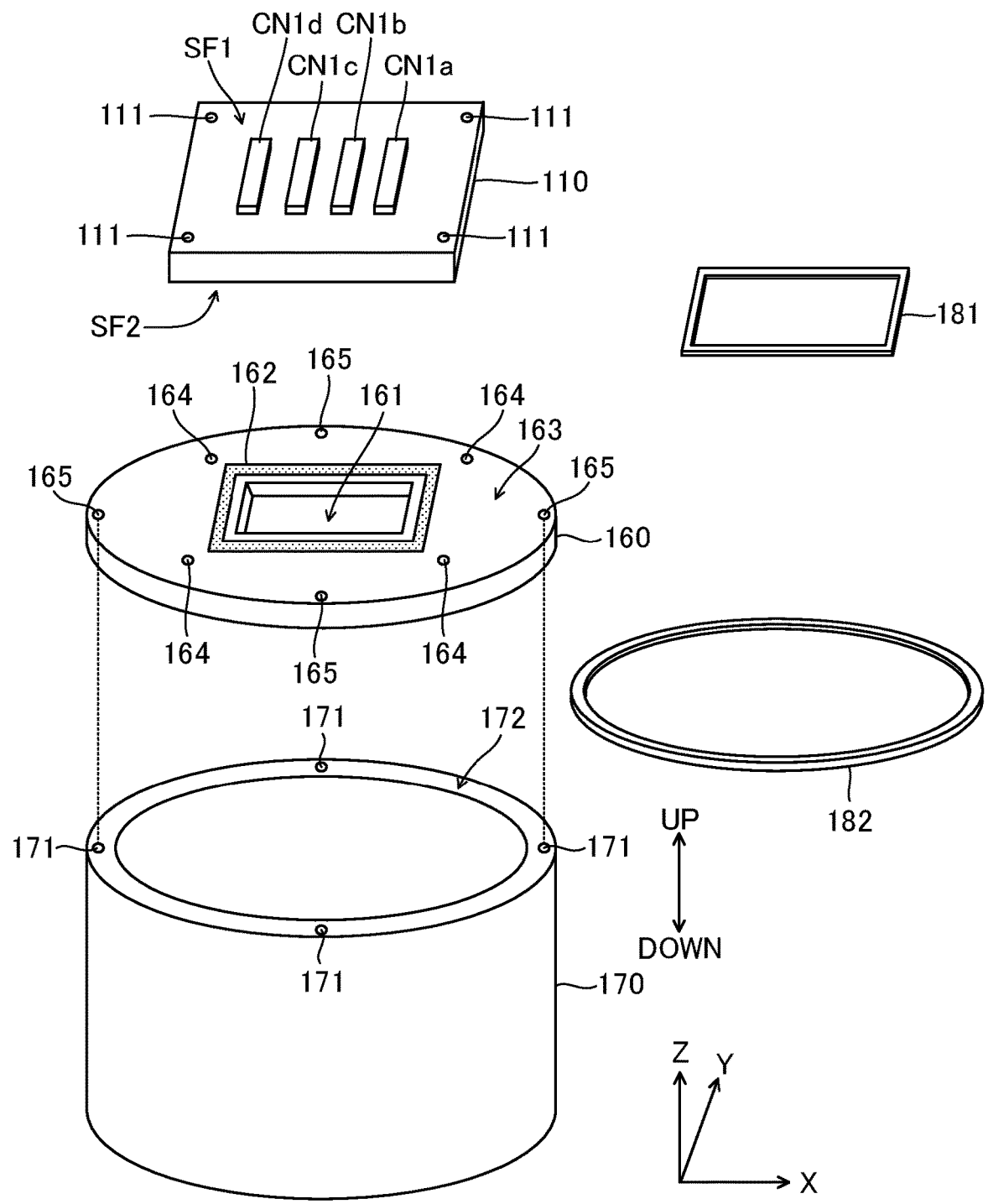
FIG. 11 is an exploded part perspective view of an X-ray imaging apparatus using the current introduction board in connection with the first embodiment of the present invention.

FIG. 11 is an exploded part perspective view of the X-ray imaging apparatus 1 using the current introduction board 110. The X-ray imaging apparatus 1 structured as shown in FIG. 11 includes a current introduction board 110, a board coupling component 160, a chamber 170, a rubber ring 181 used to hermetically seal between the current introduction board 110 and the board coupling component 160, and a copper gasket 182 used to hermetically seal between the board coupling component 160 and the chamber 170. The rubber ring 181 is a sealing component generally called an O-ring, and is a ring-shaped piece of rubber with a circular sectional shape.

Figure 12:
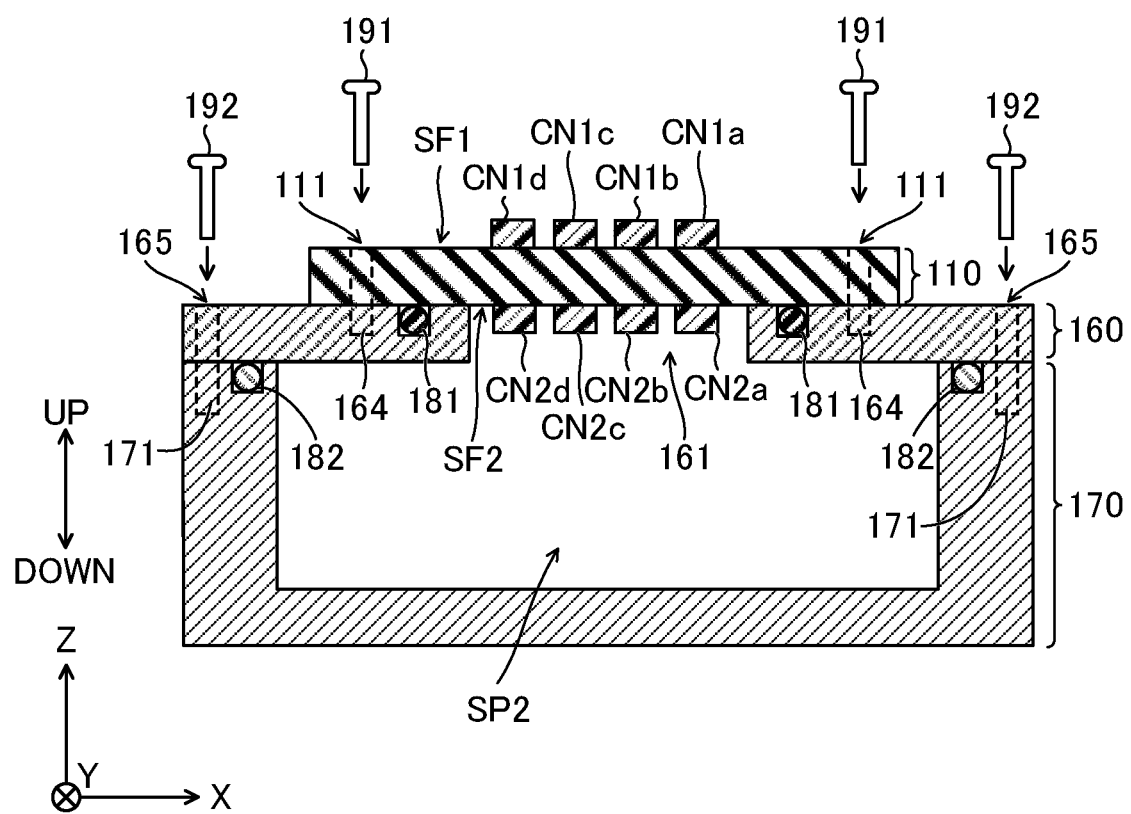
FIG. 12 is a part sectional view of the X-ray imaging apparatus with its components coupled together in connection with the first embodiment of the present invention.

FIG. 12 is a part sectional view of the X-ray imaging apparatus 1 showing how the current introduction board 110 and the board coupling component 160 are joined together via the rubber ring 181 and how the board coupling component 160 and the chamber 170 are joined together via the gasket 182. FIG. 12 is a sectional view on a sectional plane that does not pass through any of the bolt holes 111 provided in the current introduction board 110 and the bolt holes 164, 165, and 171 (described later) provided in the board coupling component 160 and in the chamber 170.

It can be understood that the chamber 170 functions as the chamber 20 in FIG. 1 and that the current introduction board 110 and the board coupling component 160 constitute the current introduction terminal block 10 in FIG. 1. It can instead be understood that the current introduction board 110 functions as the current introduction terminal block 10 in FIG. 1 and that the board coupling component 160 and the chamber 170 constitute the chamber 20 in FIG. 1. The board coupling component 160 and the chamber 170 may be configured as a unitary chamber (in that case, the gasket 182 is not necessary).

The board coupling component 160 is a component in the shape of a disc, and the chamber 170 is a component in the shape of a cylinder. The board coupling component 160 and the chamber 170 are formed of metal such as stainless steel. The center axis of the disc defined by the board coupling component 160 and the center axis of the cylinder defined by the chamber 170 coincide, and are parallel to the Z axis.

In a central part of the board coupling component 160, an opening 161 that penetrates it in the Z-axis direction is provided so that, when the board coupling component 160 and the current introduction board 110 are coupled together, the connectors CN2a to CN2d are located in the opening 161 (see FIG. 12). Although here the opening 161 has a rectangular shape on the XY plane, it may instead have any other shape. In the top face 163 of the board coupling component 160, at a position surrounding the opening 161, a ring-shaped groove 162 in which to fit the rubber ring 181 is formed. In FIG. 11, the groove 162 is indicated by a dotted region (a region filled with dots). A plurality of bolt holes 164 that penetrate the board coupling component 160 between its top and bottom faces are formed in a spread manner at positions surrounding the groove 162, and also a plurality of bolt holes 165 that penetrate the board coupling component 160 between its top and bottom faces are formed in a spread manner at positions surrounding the groove 162.

Whereas the bolt holes 111 in the current introduction board 110 are simple cylindrical holes, the bolt holes 164 in the board coupling component 160 have screw threads formed inside. The rubber ring 181 is fitted in the groove 162, then the current introduction board 110 is placed on the board coupling component 160 with the face SF2 of the current introduction board 110 in contact with the rubber ring 181, and then, by use of the bolt holes 111 in the current introduction board 110 and the bolt holes 164 in the board coupling component 160, the current introduction board 110 and the board coupling component 160 are coupled together with a plurality of bolts 191.

The rubber ring 181 and the gold-plated surface 112 are so shaped that, at this point, an entire top part of the rubber ring 181 is in contact with the gold-plated surface 112 (see FIG. 4C) exposed on the face SF2 of the current introduction board 110. On the face SF2 of the current introduction board 110, elsewhere than where the gold-plated surface 112 lies, an electrically insulating resist film is exposed, and the resist film has considerably large surface irregularity (surface roughness). The surface irregularities (surface roughness) on the gold-plated surface 112 are smaller than those on the resist film, and thus letting the rubber ring 181 lie in contact with the gold-plated surface 112 helps improve the airtightness provided by the rubber ring 181.

In a part 172 of the chamber 170 located in a peripheral part of the top face of the chamber 170, a plurality of bolt holes 171 are formed in a spread manner. Whereas the bolt holes 165 in the board coupling component 160 are simple cylindrical hole, the bolt holes 171 in the chamber 170 have screw threads formed inside. Though not shown in FIG. 11 for the sake of simple illustration, in the part 172, inside the circle passing through the respective centers of the plurality of bolt holes 171, a ring-shaped groove in which to fit the gasket 182 is formed. With the gasket 182 held between this groove and the bottom face of the board coupling component 160, by use of the bolt holes 165 in the board coupling component 160 and the bolt holes 171 in the chamber 170, the board coupling component 160 and the chamber 170 are coupled together with a plurality of bolts 192.

As a result, as shown in FIG. 12, the space surrounded by the part of the face SF2 of the current introduction board 110 located inside the rubber ring 181, the rubber ring 181, the inner wall of the board coupling component 160 (the circumferential wall of the opening 161), the gasket 182, and the inner wall of the chamber 170 constitute the space SP2 to be kept under a vacuum. Though not shown in FIG. 12 (see FIG. 1), in the space SP1, the metal terminals of the connectors CN1a to CN1d are connected to the sensor driver/signal processor 50 via the wiring bunch WR1 comprising a plurality of wirings; in the space SP2, the metal terminals of the connectors CN2a to CN2d are connected to the X-ray image sensor 40 via the wiring bunch WR2 comprising a plurality of wirings. The wirings that constitute the wiring bunch WR1 may be cables or may include patterns on a board. Similar description applies to the wiring bunch WR2.

The sensor driver/signal processor 50 and the X-ray image sensor 40 are connected together via the wiring bunch WR1, the metal terminals of the connectors mounted on the face SF1, the pads PD1 on the face SF1, the through via holes formed in the current introduction board 110, the pads PD2 on the face SF2, the metal terminals of the connectors mounted on the face SF2, and the wiring bunch WR2, so that, via these, a plurality of electric signals (including, for example, a sensor control signal and an imaging signal) can be transmitted and received independently of each other and in addition the sensor driver/signal processor 50 can supply driving electric power to the X-ray image sensor 40.

In this embodiment, as described above, a plurality of through via holes that penetrate the current introduction board 110 between its faces SF1 and SF2 are provided. For each through via hole (131, 132), the hole part of the through via hole is filled with a resin material, and pads (PD1, PD2) that cover the hole part on the faces SF1 and SF2 respectively are formed. In this way, transfer of electric signals and electric power between the faces SF1 and SF2 is made possible, and passage of fluid (here, gas) between the faces SF1 and SF2 via the hole part is restrained.

Figure 25:
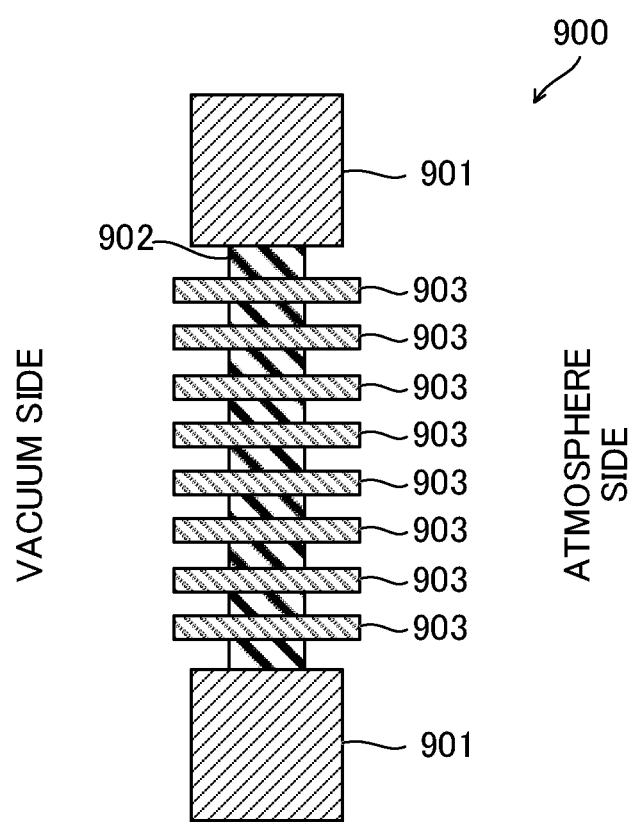
FIG. 25 is a sectional view of conventional current introduction terminals.

It is thus possible to arrange wirings with a density far exceeding the limit of the conventional technologies. Specifically, with the conventional pin structure as shown in FIG. 25 or disclosed in Non-Patent Document 1, contacts (pin terminals in such pin structures) can only be arranged with a pitch of 1.25 mm or 2.5 mm (that is, it is impractical to arrange contacts with any smaller pitch); in contrast, with the structure according to this embodiment, it is easily practicable to arrange contacts with a pitch equal to or smaller than 1 mm (in this embodiment, contacts are pads). For example, it is easily practicable to arrange contacts with a pitch of 0.2 mm to 0.3 mm, and even to arrange contacts with a pitch of 0.1 mm. Arranging contacts with a pitch of 0.1 mm in two dimensions makes it possible, as compared with the conventional pin structure as shown in FIG. 25 or disclosed in Non-Patent Document 1, to introduce 100 times or more the number of contacts per unit area and thus to achieve a tremendously high density.

The adoption of a structure where the entire hole part of a through via hole is covered by metal pads (PD1, PD2) makes it possible to secure airtightness of the chamber and to reduce outgas from the filling resin. As a result, in a vacuous environment, a large-area X-ray image sensor array like the one shown in FIG. 3 can be operated at a high resolution and a high frame rate. That is, the invention according to this embodiment paves the way for the development of a large-area X-ray image sensor array in a vacuous environment, which has conventionally been difficult.

As compared with the conventional pin structure as shown in FIG. 25 or disclosed in Non-Patent Document 1, this embodiment employs a structure that is extremely easy to manufacture. This greatly reduces costs (e.g., to about one tenth), allows manufacture in large quantities, and permits free choice and use of commercially available connectors for use in the atmosphere, offering tremendously increased versatility (the same is true with the second and third embodiments described later).

In the method of Patent Document 1, a plurality of ceramic green sheet boards in which through via holes are formed at mutually corresponding positions are prepared, and these boards are stacked together and are sintered; thereby a board thickness that withstands the pressure under a vacuum and through via hole are formed. This results in extremely high manufacturing difficulty and manufacturing costs, making the method unsuitable for mass-production. In contrast, in this embodiment, a single board with such a thickness as to withstand the pressure with a vacuum inside the chamber is prepared; holes are formed in the board with a drill, and then through via holes are formed. Thus, there is no need for a board stacking technique. This results in low manufacturing costs, and allows mass-production.

On the faces SF1 and SF2 of the current introduction board 110, the respective pads (PD1, PD2) not only function as connecting surfaces with the terminals that are supposed to conduct to those pads (the metal terminals of the connectors in the example shown in FIGS. 7A and 7B and in FIGS. 8A and 8B) but also function to avoid and restrain exposure of the resin material that fills the hole part of the through via hole. Exposure of the resin material in the space SP2 makes it difficult to obtain a high degree of vacuum due to outgas from the resin material. Letting the pads function not only as connecting surfaces with terminals but also to restrain exposure of the resin material helps high-density introduction of contacts combined with an improved degree of vacuum. The hole part of the through via hole penetrating between the faces SF1 and SF2 can be filled with a predetermined filling material, and the filling material may be other than a resin material. Even with a filling material other than a resin material, if no pads are provided, there is concern for outgas. In the method of Non-Patent Document 1, it appears that sealing between the printed board and the pin terminals is achieved by sealing with epoxy resin the gaps between the insertion holes for the pin terminals provided in the printed board and the pin terminals. This leaves the epoxy resin for sealing to be exposed on the vacuum side, and hence leaves concern for a diminished degree of vacuum due to outgas from the epoxy resin.

This embodiment employs a rectilinear current introduction design in which, on the plurality of pads PD1 formed on the face SF1 of the current introduction board 110, the first surface-mount connector CN1a including a plurality of metal terminals is mounted; on the plurality of pads PD2 formed on the face SF2 of the current introduction board 110, the second surface-mount connector CN2a including a plurality of metal terminals is mounted; and the plurality of metal terminals of the connector CN1a are made to conduct to the plurality of metal terminals of the connector CN2a via the plurality of pads PD1, the plurality of through via holes, and the plurality of pads PD2 (in other words, the metal terminals of the connector CN1a are made to conduct to the corresponding metal terminals of the connector CN2a via the corresponding pads PD1, the corresponding through via holes, and the corresponding pads PD2) (similar description applies to the pair of connectors CN1b and CN2b, the pair of connectors CN1c and CN2c, and the pair of connectors CN1d and CN2d). This permits extremely high-density current introduction. Rectilinear introduction of electric currents and wirings facilitates the designing of distributed parameters, and is advantageous in bandwidth widening.

On the current introduction board 110 according to this embodiment, a total of four sets each comprising a first pad group on the face SF1 (e.g., 121a; see FIG. 5), a second pad group on the face SF2 (e.g., 122a; see FIG. 6), and a plurality of through via holes connecting those together are provided, and for each of these sets, a first and a second surface-mount connector (e.g., CN1a, CN2a) are mounted on the faces SF1 and SF2. The first and second pad groups and the first and second surface-mount connectors are, for the first group, the pad groups 121a and 122a and the connectors CN1a and CN2a and, for the second group, the pad groups 121b and 122b and the connectors CN1b and CN2b (similar description applies to the third and fourth groups). The number of the above-mentioned sets provided on the current introduction board 110 may be any number equal to or larger than two, and may even be one.

The first embodiment includes Practical Examples EX1_1 to EX1_5 presented below. Specific examples and modified example of the features described above in connection with the first embodiment are described in Practical Examples EX1_1 to EX1_5 presented below. Unless inconsistent, any feature described in connection with any of Practical Examples EX1_1 to EX1_5 can be applied to any other of the practical examples.

Practical Example EX1_1

Practical Example EX1_1 will be described. The copper film 132 (see FIG. 10) forming the through via hole is given a thickness of, for example, 20 to 50 µm. The copper film 141, the nickel film 142, and the nickel film 142 forming the pad PD1 are given thicknesses of, for example, 25 µm, 5 µm, and 0.5 µm respectively. The copper film 144, the nickel film 145, and the gold film 146 forming the pad PD2 can be given thicknesses equal to those of the copper film 141, the nickel film 142, and the gold film 143 respectively. Needless to say, any specific value mentioned here is merely an example and can be modified as desired.

Practical Example EX1_2

Practical Example EX1_2 will be described. The current introduction board 11 can be given a desired thickness. In a case where the pressure difference (air pressure difference) between the SP1 and SP2 acts in the thickness direction of the current introduction board 11, the current introduction board 11 is given such a thickness as to withstand the pressure difference. For example, in a case where a glass epoxy board is used as the current introduction board 11, giving the current introduction board 11 a thickness of 5 mm or more permits the current introduction board 11 to satisfactorily withstand the pressure difference (1 atm at the maximum) between the SP1 and SP2.

Practical Example EX1_3

Practical Example EX1_3 will be described. In the example shown in FIGS. 4A to 4C, it is assumed that the connectors (CN1a to CN1d) mounted on the face SF1 side and the connectors (CN2a to CN2d) mounted on the face SF2 side are identical connectors. Instead, the connector mounted on the face SF1 side and the connector mounted on the face SF2 side can be connectors that are different from each other in shape etc. Given, however, that the current introduction board 110 is so structured that one pad PD1 and the one pad PD2 that is supposed to conduct to the pad PD1 are aligned on a straight line in the direction normal to the faces SF1 and SF2, the pitch of the metal terminals of the connector CN1a and the pitch of the metal terminals of the connector CN2a are equal. Similar description applies to the connectors CN1b and CN2b, the connectors CN1c and CN2c, and the connectors CN1d and CN2d.

The number of connectors mounted on the face SF1 of the current introduction board 110 may be one, or may be any number equal to or larger than two. Likewise, the number of connectors mounted on the face SF2 of the current introduction board 110 may be one, or may be any number equal to or larger than two.

Practical Example EX1_4

Practical Example EX1_4 will be described. While a structure where connection between the pads PD1 on the face SF1 and the sensor driver/signal processor 50 is achieved via the connectors CN1a to CN1d is discussed above, connection between the pad PD1 and the sensor driver/signal processor 50 can instead be achieved by connecting one ends of cables directly to the pads PD1 on the face SF1 and connecting the other ends of the cables to the sensor driver/signal processor 50. For example, one ends of flexible cables configured as a flexible board can be connected, by soldering, directly to the pads PD1 on the face SF1 and the other ends of the flexible cables can be connected to the sensor driver/signal processor 50 directly or via additional relay wirings. In that case, the flexible cables constitute the wiring bunch WR1.

Likewise, connection between the pad PD2 and the X-ray image sensor 40 can instead be achieved by connecting one ends of cables directly to the pads PD2 on the face SF2 and connecting the other ends of the cables to the X-ray image sensor 40. For example, one ends of flexible cables configured as a flexible board can be connected, by soldering, directly to the pads PD2 on the SF2 and the other ends of the flexible cables can be connected to the X-ray image sensor 40 directly or via additional relay wirings. In that case, the flexible cables constitutes the wiring bunch WR2.

Practical Example EX1_5

Practical Example EX1_5 will be described. In the above description, it is assumed that the current introduction terminal block 10 is formed by use of a double-sided board (two-layer board) in which wiring patterns can be formed only on two faces SF1 and SF2. Instead, the current introduction board 110 can be formed by use of a multi-layer boards.

It is above assumed that the face SF1 (and hence the face SF2) of the current introduction board 110 has a rectangular shape. It can actually have any shape, and can have, for example, a circular shape.

It is above assumed that a glass epoxy board is used as the current introduction board 110. This, however, is not meant to limit the material of the current introduction board 110; a glass composite board, a ceramic board, or the like can be used as the current introduction board 110.

Second Embodiment

Figure 13A:
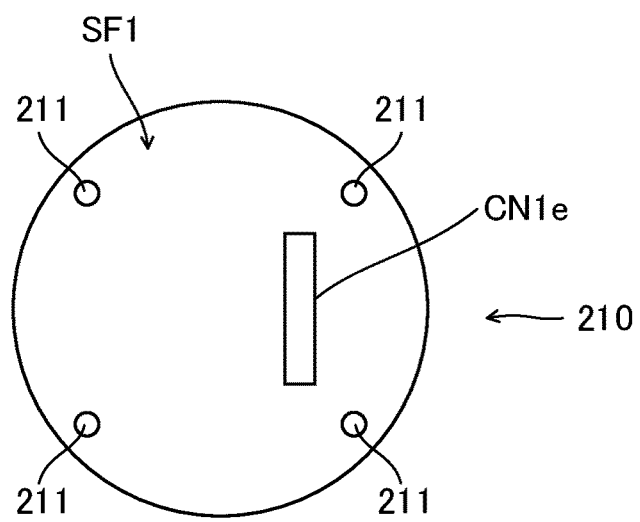
FIGS. 13A to 13C are exterior views of a current introduction board according to a second embodiment of the present invention.
Figure 13B:
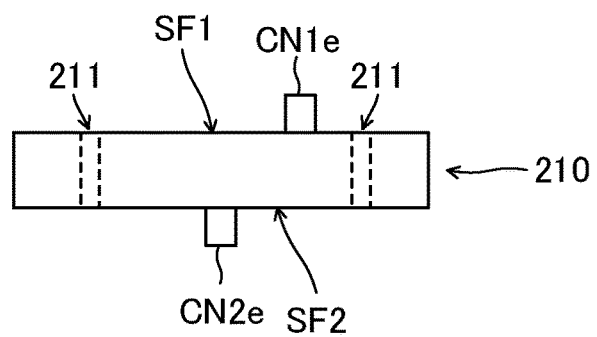
Figure 13C:
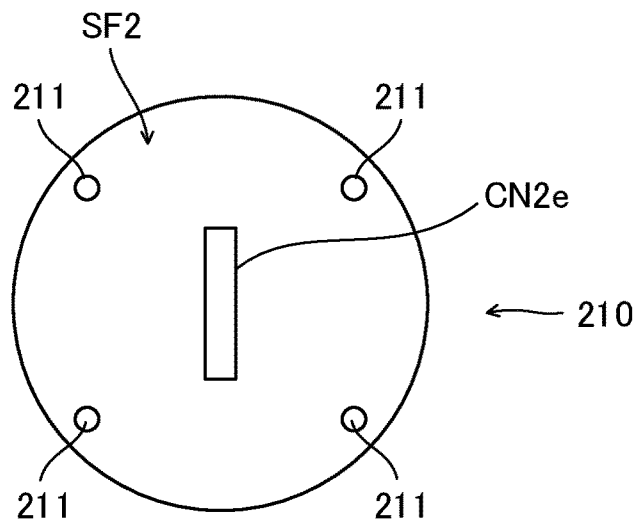

A second embodiment of the present invention will be described. FIGS. 13A to 13C are exterior views of a current introduction board 210 according to the second embodiment. FIG. 13A is a plan view of the current introduction board 210 as seen from the face SF1 side, FIG. 13B is a side view of the current introduction board 210, and FIG. 13C is a plan view of the current introduction board 210 as seen from the face SF2 side. In the second embodiment, the current introduction board 210 is used as the current introduction board 11 provided in the current introduction terminal block 10 in FIG. 1. In the second embodiment, the faces SF1 and SF2 refer to the faces SF1 and SF2 on the current introduction board 210.

The current introduction board 210 is a multi-layer board that has an inner layer between the faces SF1 and SF2 and in which wirings (patterns) can be formed not only on the faces SF1 and SF2 but also in the inner layer. In the current introduction board 210, the face SF1 (and hence the face SF2) can have any shape, and it is here assumed to have a circular shape. Four bolt holes 211 each in the shape of a cylinder penetrating between the faces SF1 and SF2 are formed in a peripheral part of the current introduction board 210.

On the face SF1 of the current introduction board 210, a connector CN1e is mounted; on the face SF2 of the current introduction board 210, a connector CN2e is mounted. The connectors CN1e and CN2e are each a surface-mount connector that includes a case formed of an electrically insulating material such as a resin or a ceramic and a plurality of metal terminals protruding from the case. The arrangement position of the connector CN2e is deviated from the arrangement position of the connector CN1e in the X-axis or Y-axis direction.

Figure 14:
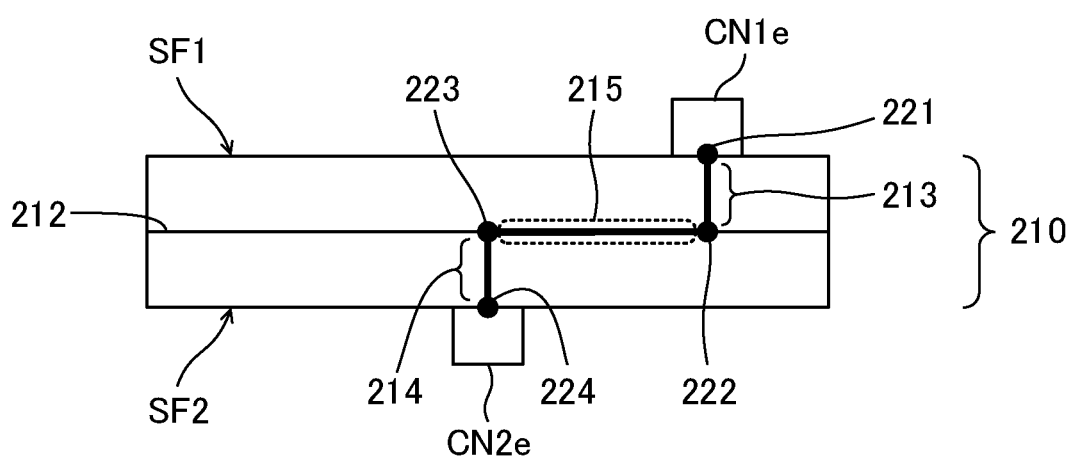
FIG. 14 is a diagram illustrating how conduction between connectors is secured in connection with the second embodiment of the present invention.

With reference to FIG. 14, how conduction between the connectors CN1e and CN2e is secured will be described. In FIG. 14, the reference sign "212" identifies the inner layer provided in the current introduction board 210, the reference signs "221" and "224" identify metal parts provided on the faces SF1 and SF2 respectively, and the reference signs "222" and "223" identify metal parts provided at different positions in the inner layer 212. Although the current introduction board 210 may have two or more inner layers formed in it, attention is paid here to only one inner layer 212. The current introduction board 210 includes a blind via hole 213 that makes the metal parts 221 and 222 to conduct to each other, a blind via hole 214 that make the metal parts 223 and 224 conduct to each other, and an inner-layer wiring 215 that makes the blind via holes 213 and 214 conduct to each other within the inner layer 212 (in other words, that makes the metal parts 222 and 223 conduct to each other within the inner layer 212). On the XY plane, the arrangement positions of the blind via holes 213 and 214 are deviated from each other.

In the following description, "blind via hole" will be abbreviated to "BVH". The BVH 213 is a via hole that penetrates between the face SF1 and the inner layer 212 but that does not penetrate between the faces SF1 and SF2. The BVH 214 is a via hole that penetrates between the face SF2 and the inner layer 212 but that does not penetrate between the faces SF1 and SF2. Thus, there is no (strictly, only negligibly little) leakage of air between the faces SF1 and SF2 via the BVHs 213 and 214.

The metal part 221 is a pad that is supposed to be connected, by soldering, to a metal terminal of the connector CN1e, and the metal part 224 is a pad that is supposed to be connected, by soldering, to a metal terminal of the connector CN2e. The pads as the metal parts 221 and 224 are similar to the pads PD1 and PD2 in the first embodiment, and accordingly the pads as the metal parts 221 and 224 will also be referred to as pads PD1 and PD2 in the following description. The metal terminal of the connector CN1e that is supposed to conduct to the pad PD1 (221) is bonded, by soldering, directly to the pad PD1, and the metal terminal of the connector CN2e that is supposed to conduct to the pad PD2 (224) is bonded, by soldering, directly to the pad PD2.

In this embodiment, a set comprising a pad PD1 (221), a BVH 213, an inner-layer wiring 215, a BVH 214, and a pad PD2 (224) that conduct to each other constitute a unit current introducer, and a plurality of such unit current introducers are formed in the current introduction board 210 so that a plurality of wirings constituting the wiring bunch WR1 are connected to, so as to conduct to, a plurality of wirings constituting the wiring bunch WR2 via the connector CN1e, the plurality of unit current introducers, and the connector CN2e.

Figure 15:
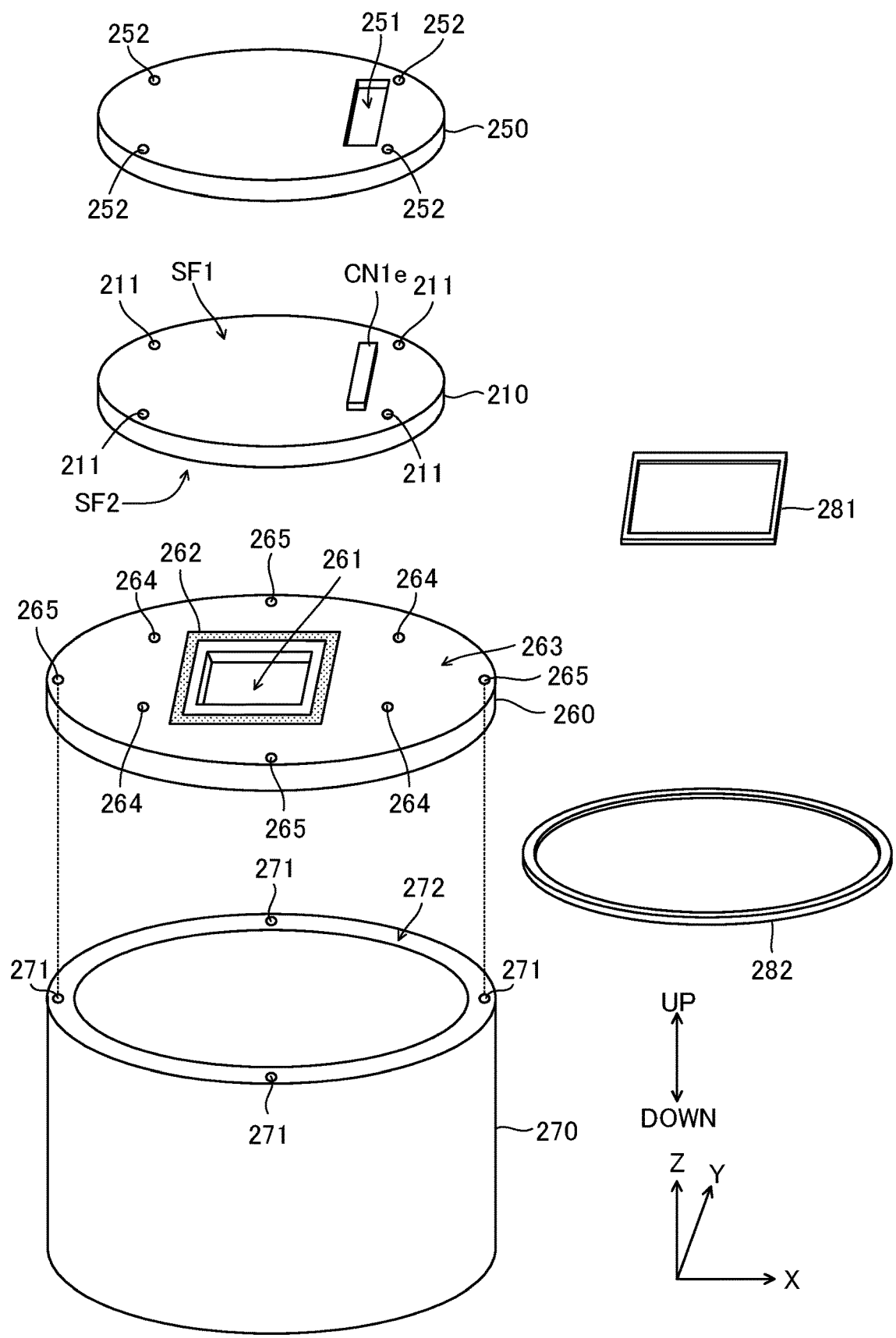
FIG. 15 is an exploded part perspective view of an X-ray imaging apparatus using the current introduction board in connection with the second embodiment of the present invention.

FIG. 15 is an exploded part perspective view of the X-ray imaging apparatus 1 using the current introduction board 210. The X-ray imaging apparatus 1 structured as shown in FIG. 15 includes a current introduction board 210, board coupling components 250 and 260, a chamber 270, a rubber ring 281 used to hermetically seal between the current introduction board 210 and the board coupling component 260, and a copper gasket 282 used to hermetically seal between the board coupling component 260 and the chamber 270. The rubber ring 281 is a sealing component generally called an O-ring, and is a ring-shaped piece of rubber with a circular sectional shape.

Figure 16:
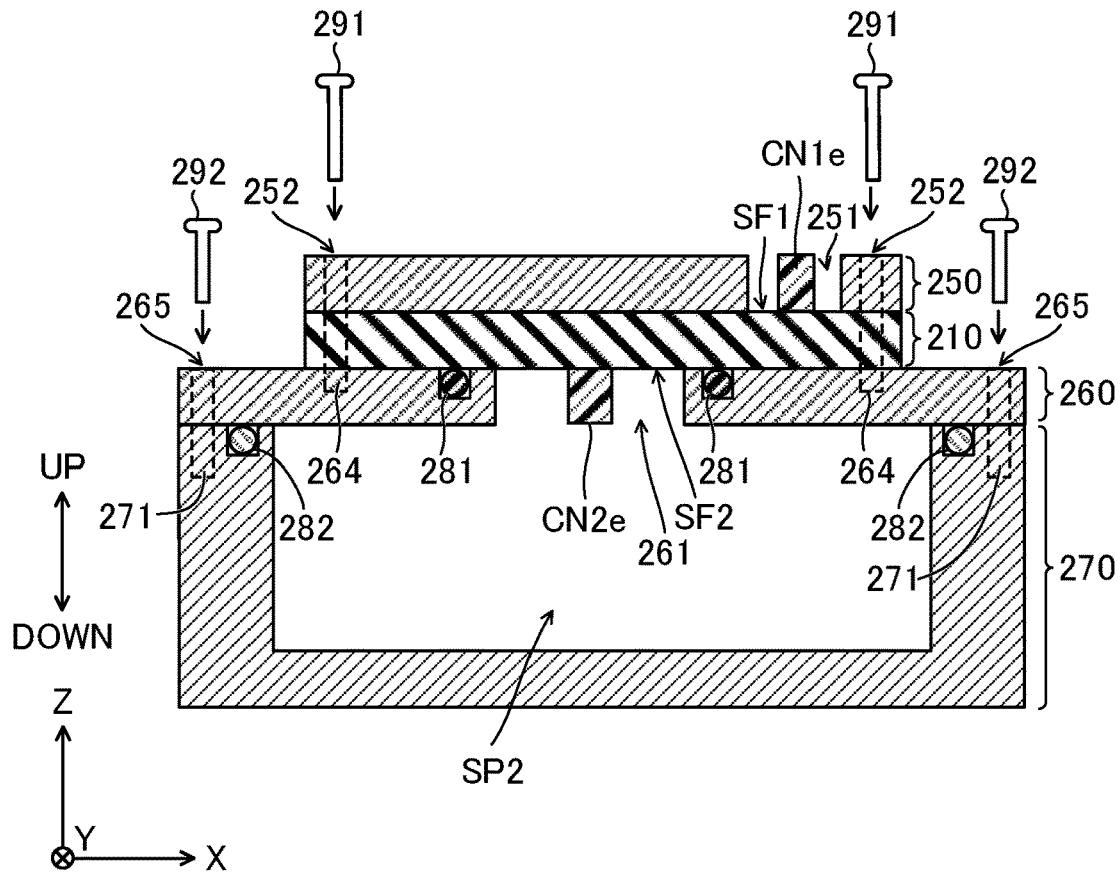
FIG. 16 is a part sectional view of the X-ray imaging apparatus with its components coupled together in connection with the second embodiment of the present invention.

FIG. 16 is a part sectional view of the X-ray imaging apparatus 1 showing how the board coupling component 250 and the current introduction board 210 are joined together, how the current introduction board 210 and the board coupling component 260 are joined together via the rubber ring 281, and how the board coupling component 260 and the chamber 270 are joined together via the gasket 282. The joining-together of the current introduction board 210 and the board coupling components 250 and 260 is achieved by holding the current introduction board 210 between the board coupling components 250 and 260 and fastening them together. FIG. 16 is a sectional view on a sectional plane that does not pass through any of the bolt holes 211 provided in the current introduction board 210 and the bolt holes 252, 264, 265, and 271 (described later) provided in the board coupling components 250 and 260 and in the chamber 270.

It can be understood that the chamber 270 functions as the chamber 20 in FIG. 1 and that the current introduction board 210 and the board coupling components 250 and 260 constitute the current introduction terminal block 10 in FIG. 1. The board coupling component 260 and the chamber 270 may be configured as a unitary chamber (in that case, the copper 282 is not necessary).

The board coupling components 250 and 260 are each a component in the shape of a disc, and the chamber 270 is a component in the shape of a cylinder. The board coupling components 250 and 260 and the chamber 270 are formed of metal such as stainless steel. The center axis of disc defined by the board coupling component 250, the center axis of the disc defined by the board coupling component 260, and the center axis of the cylinder defined by the chamber 270 coincide, and are parallel to the Z axis. So that a peripheral part of the board coupling component 260 may be used to achieve coupling with the chamber 270, the radius of the disc defined by the board coupling component 260 is larger than the radius of the disc defined by the board coupling component 250.

In the board coupling component 250, an opening 251 that penetrates it in the Z-axis direction is provided so that, when the board coupling component 250 and the current introduction board 210 are coupled together, the connector CN1e is located in the opening 251. Although here the opening 251 has a rectangular shape on the XY plane, it may instead have any other shape. A plurality of bolt holes 252 that penetrate the board coupling component 250 between its top and bottom faces are formed in a spread manner at positions surrounding the opening 251.

In a central part of the board coupling component 260, an opening 261 that penetrates it in the Z-axis direction is provided so that, when the board coupling component 260 and the current introduction board 210 are coupled together, the connector CN2e is located in the opening 261. Although here the opening 261 has a rectangular shape on the XY plane, it may instead have any other shape. In the top face 263 of the board coupling component 260, at a position surrounding the opening 261, a ring-shaped groove 262 in which to fit the rubber ring 281 is formed. In FIG. 15, the groove 262 is indicated by a dotted region (a region filled with dots). A plurality of bolt holes 264 that penetrate the board coupling component 260 between its top and bottom faces are formed in a spread manner at positions surrounding the groove 262, and also a plurality of bolt holes 265 that penetrate the board coupling component 260 between its top and bottom faces are formed in a spread manner at positions surrounding the groove 262.

Whereas the bolt holes 252 in the board coupling component 250 and the bolt holes 211 in the current introduction board 210 are simple cylindrical holes, the bolt holes 264 in the board coupling component 260 have screw threads formed inside. The rubber ring 281 is fitted in the groove 262; then the current introduction board 210 is placed on the board coupling component 260 with the face SF2 of the current introduction board 210 in contact with the rubber ring 281, and the current introduction board 210 is held between the board coupling components 250 and 260; then, by use of the bolt holes 252, 211, and 264, the board coupling component 250, the current introduction board 210, and the board coupling component 260 are coupled together with a plurality of bolts 291. Now, a predetermined ring-shaped part of the face SF2 of the current introduction board 210 is in close contact with the rubber ring 281, and this prevents passage of fluid (here, gas) between inside and outside the rubber ring 281.

On the face SF2 of the current introduction board 210, at least in the above-mentioned predetermined ring-shaped part in contact with the rubber ring 281, a gold-plated surface can be formed so as to be exposed. As in the first embodiment, this helps improve the airtightness provided by the rubber ring 281.

In a part 272 of the chamber 270 located in a peripheral part of the top face of the chamber 270, a plurality of bolt holes 271 are formed in a spread manner. Whereas the bolt holes 265 in the board coupling component 260 are simple cylindrical hole, the bolt holes 271 in the chamber 270 have screw threads formed inside. Though not shown in FIG. 15 for the sake of simple illustration, in the part 272, inside the circle passing through the respective centers of the plurality of bolt holes 271, a ring-shaped groove in which to fit the gasket 282 is formed. With the gasket 282 held between this groove and the bottom face of the board coupling component 260, by use of the bolt holes 265 in the board coupling component 260 and the bolt holes 271 in the chamber 270, the board coupling component 260 and the chamber 270 are coupled together with a plurality of bolts 292.

As a result, as shown in FIG. 16, the space surrounded by the part of the face SF2 of the current introduction board 210 located inside the rubber ring 281, the rubber ring 281, the inner wall of the board coupling component 260 (the circumferential wall of the opening 261), the gasket 282, and the inner wall of the chamber 270 constitute the space SP2 to be kept under a vacuum. Though not shown in FIG. 16 (see FIG. 1), in the space SP1, the metal terminals of the connector CN1e are connected to the sensor driver/signal processor 50 via the wiring bunch WR1 comprising a plurality of wirings; in the space SP2, the metal terminals of the connector CN2e are connected to the X-ray image sensor 40 via the wiring bunch WR2 comprising a plurality of wirings. The wirings that constitute the wiring bunch WR1 may be cables or may include patterns on a board. Similar description applies to the wiring bunch WR2.

The sensor driver/signal processor 50 and the X-ray image sensor 40 are connected together via the wiring bunch WR1, the metal terminals of the connectors mounted on the face SF1, the pads PD1 on the face SF1, the BVHs 213 and 214 and the inner-layer wiring 215 (see FIG. 14) formed in the current introduction board 210, the pads PD2 on the face SF2, the metal terminals of the connectors mounted on the face SF2, and the wiring bunch WR2, so that, via these, a plurality of electric signals (including, for example, a sensor control signal and an imaging signal) can be transmitted and received independently of each other and in addition the sensor driver/signal processor 50 can supply driving electric power to the X-ray image sensor 40.

The second embodiment provides effects, including an increased contact arrangement density, similar to those that the first embodiment provides.

Although the description above deals with an example where only one connector is mounted on the face SF1 of the current introduction board 210, instead, a plurality of connectors can be mounted on the face SF1 of the current introduction board 210. Likewise, a plurality of connectors can be mounted on the face SF2 of the current introduction board 210.

Figure 17:
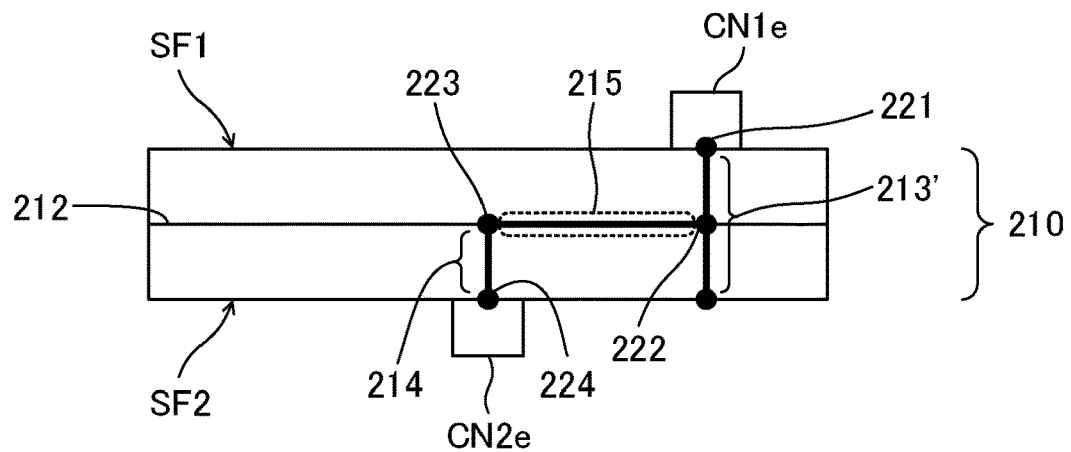
FIG. 17 is a diagram illustrating a modified example of how conduction between connectors is secured in connection with the second embodiment of the present invention.
Figure 18:
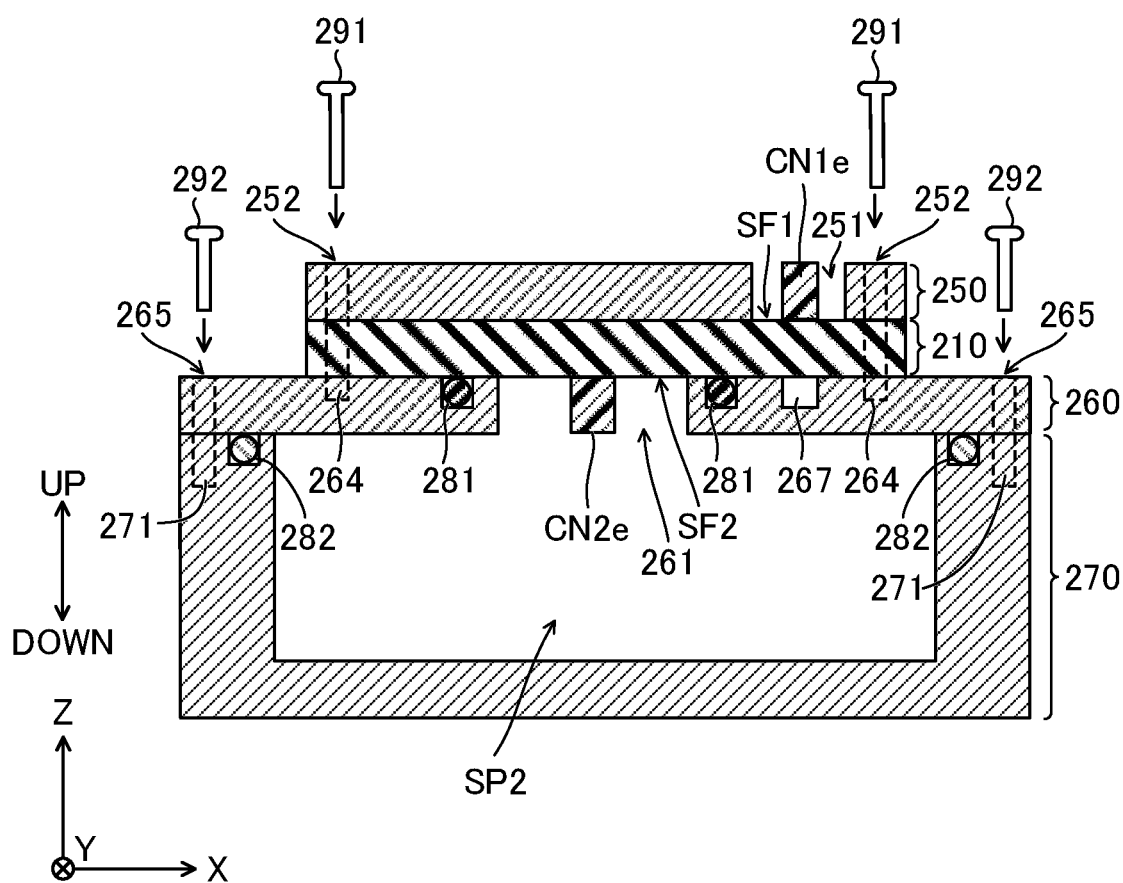
FIG. 18 is a part sectional view of a modified example of the X-ray imaging apparatus with its components coupled together in connection with the second embodiment of the present invention.

In the current introduction board 210, the BVH 213 (see FIG. 14) can be replaced with a through via hole 213' as shown in FIG. 17. In that case, as the connector CN1e, a through-hole connector (a connector of the type of which the metal terminals protruding from its case are inserted in through holes) can be used, and this allows more flexibility in designing. In that case, however, when the board coupling components 250 and 260 and the current introduction board 210 are coupled together, the metal terminals of the connector CN1e penetrate through the through via holes 213' and stick out from the face SF2 to be bonded, by soldering, to lands (lands conducting to the through via holes 213') formed on the face SF2. To cope with this, as shown in FIG. 18, a recess 267 can be provided in the board coupling component 260 to prevent contact of the metal terminals of the connector CN1e sticking out from the face SF2 with the board coupling component 260. On the XY plane, the recess 267 is arranged outside the rubber ring 281, and is not located inside the space SP2. In the first embodiment, the hole part of a through via hole is filled with a filling material; no such filling is applied to the hole part of the through via hole 213'.

Third Embodiment

Figure 19A:
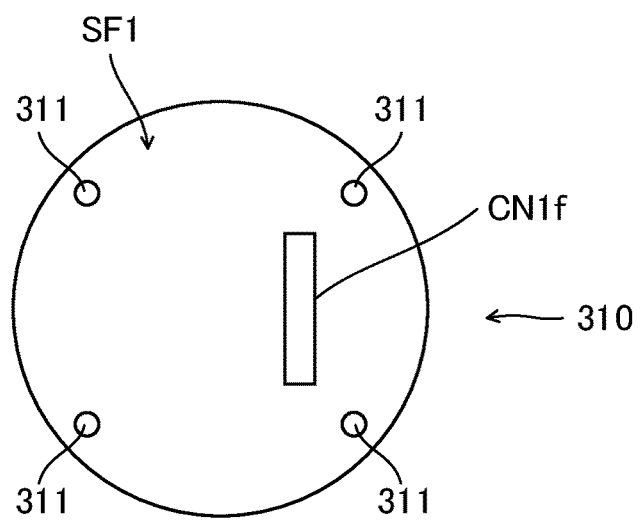
FIGS. 19A to 19C are exterior views of a current introduction board according to a third embodiment of the present invention.
Figure 19B:
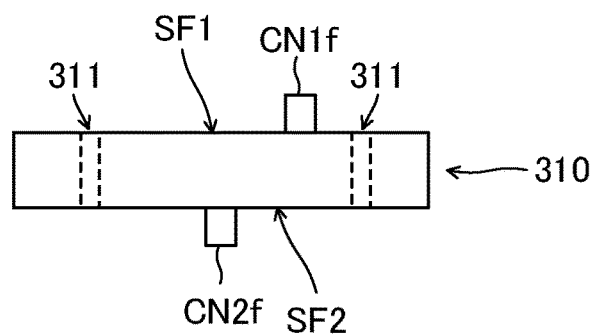
Figure 19C:
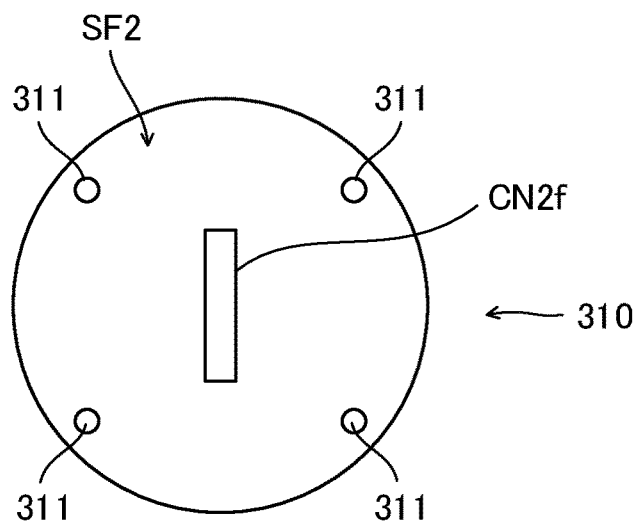

A third embodiment of the present invention will be described. FIGS. 19A to 19C are exterior views of a current introduction board 310 according to the third embodiment. FIG. 19A is a plan view of the current introduction board 310 as seen from the face SF1 side, FIG. 19B is a side view of the current introduction board 310, and FIG. 19C is a plan view of the current introduction board 310 as seen from the face SF2 side. In the third embodiment, the current introduction board 310 is used as the current introduction board 11 provided in the current introduction terminal block 10 in FIG. 1. In the third embodiment, the faces SF1 and SF2 refer to the faces SF1 and SF2 on the current introduction board 310.

The current introduction board 310 is a multi-layer board that has an inner layer between the faces SF1 and SF2 and in which wirings (patterns) can be formed not only on the faces SF1 and SF2 but also in the inner layer. In the current introduction board 310, the face SF1 (and hence the face SF2) can have any shape, and it is here assumed to have a circular shape. Four bolt holes 311 each in the shape of a cylinder penetrating between the faces SF1 and SF2 are formed in a peripheral part of the current introduction board 310.

On the face SF1 of the current introduction board 310, a connector CN1*f* is mounted; on the face SF2 of the current introduction board 310, a connector CN2*f* is mounted. The connectors CN1*f* and CN2*f* are each a through-hole connector that includes a case formed of an electrically insulating material such as a resin or a ceramic and a plurality of metal terminals protruding from the case. As the connectors CN1*f* and CN2*f*, surface-mount connectors can instead be used. The arrangement position of the connector CN2*f* is deviated from the arrangement position of the connector CN1*f* in the X-axis or Y-axis direction.

Figure 20:
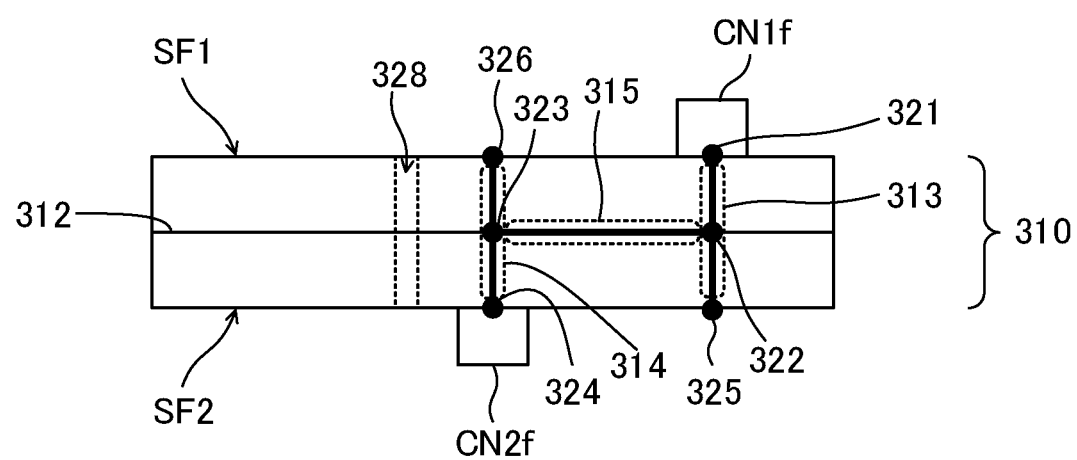
FIG. 20 is a diagram illustrating how conduction between connectors is secured in connection with the third embodiment of the present invention.

With reference to FIG. 20, how conduction between the connectors CN1*f* and CN2*f* is secured will be described. In FIG. 20, the reference sign "312" identifies the inner layer provided in the current introduction board 310, the reference signs "321" and "326" identify metal parts provided at different positions on the face SF1, the reference signs "325" and "324" identify metal parts provided at different positions on the face SF2, and the reference signs "322" and "323" identify metal parts provided at different positions in the inner layer 312. Although the current introduction board 310 may have two or more inner layers formed in it, attention is paid here to only one inner layer 312.

The current introduction board 310 includes through via holes 313 and 314 and an inner-layer wiring 315 that makes the through via holes 313 and 314 conduct to each other within the inner layer 312. The metal parts 321, 322, and 325 are aligned on a straight line along the Z-axis direction, and the metal parts 326, 323, and 324 are aligned on a straight line along the Z-axis direction. On the XY plane, the arrangement positions of the through via holes 313 and 314 are deviated from each other.

The metal parts 321, 322, and 325 can be understood as metal parts that are not parts of the through via hole 313 but that conduct to the through via hole 313; here, however, the metal parts 321, 322, and 325 are understood as parts of the metal part that constitutes the through via hole 313. Likewise, metal parts 326, 323, and 324 can be understood as metal parts that are not parts of the through via hole 314 but that conduct to the through via hole 314; here, however, the metal parts 326, 323, and 324 are understood as parts of the metal part that constitutes the through via hole 314.

The metal terminals of the connector CN1*f* formed as a through-hole connector are inserted into through via holes 313 from the face SF1 side and stick out from the face SF2 to be bonded, by soldering, to lands (lands conducting to the through via holes 313; corresponding to the metal part 325) formed on the face SF2. Likewise, the metal terminals of the connector CN2*f* formed as a through-hole connector are inserted into through via holes 314 from the face SF2 side and stick out from the face SF1 to be bonded, by soldering, to lands (lands conducting to the through via holes 314; corresponding to the metal part 326) formed on the face SF1.

In this embodiment, a set comprising a through via hole 313, an inner-layer wiring 315, and a through via hole 314 that conduct to each other constitutes a unit current introducer, and a plurality of such unit current introducers are formed in the current introduction board 310 so that a plurality of wirings constituting the wiring bunch WR1 are connected to, so as to conduct to, a plurality of wirings constituting the wiring bunch WR2 via the connector CN1*f*, the plurality of unit current introducers, and the connector CN2*f*.

In the current introduction board 310, near the connector CN2*f* and the through via hole 314, a ventilation hole 328 that penetrates between the faces SF1 and SF2 is provided. The function of the ventilation hole 328 will be described later.

The hole parts of the through via holes 313 and 314 are not filled with a filling material as in the first embodiment. This leaves concern for leakage of air between the faces SF1 and SF2 via the through via hole 313 or 314. This concern, however, is eliminated by the adoption of the structure described below.

Figure 21:
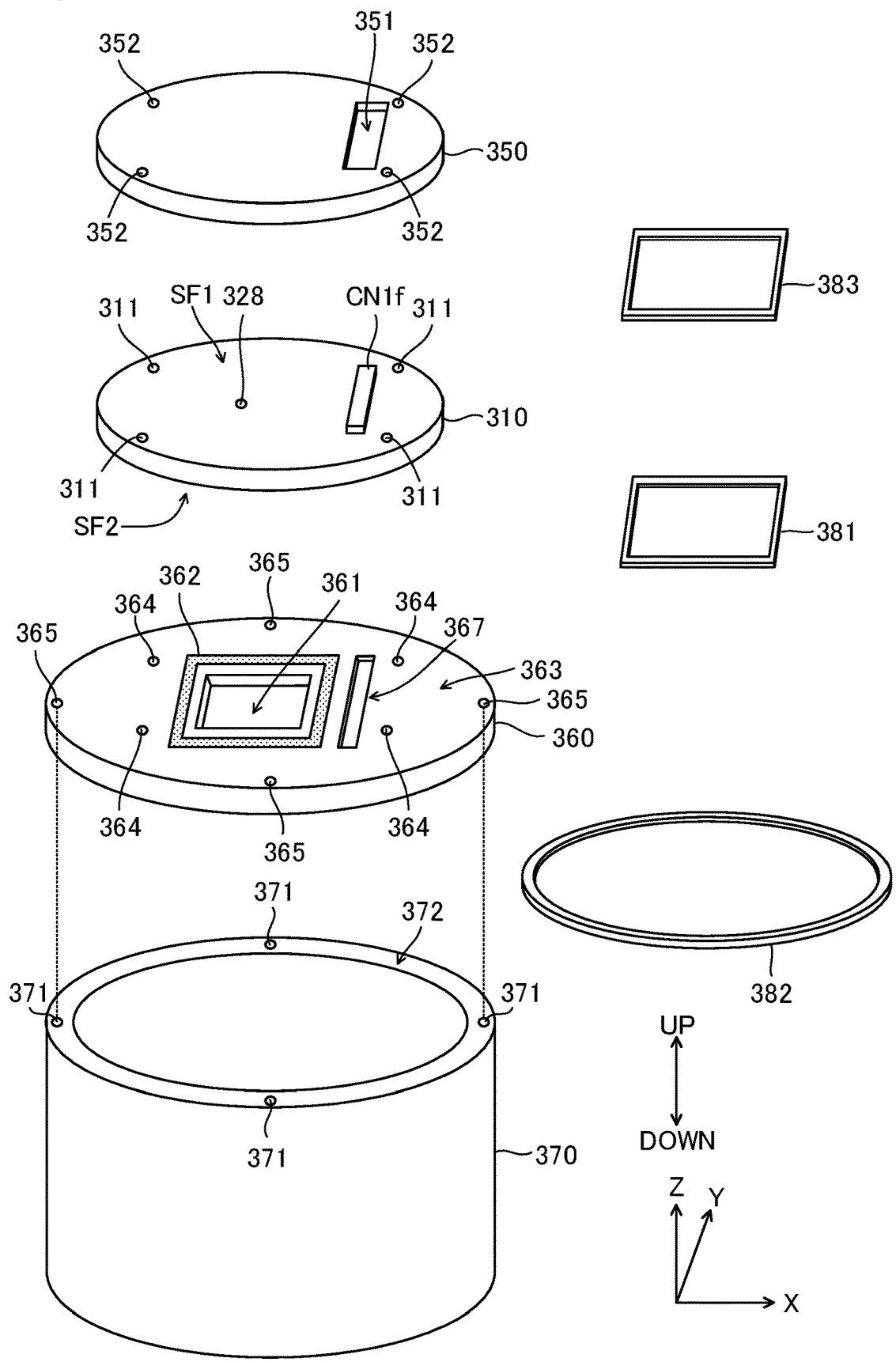
FIG. 21 is an exploded part perspective view of an X-ray imaging apparatus using the current introduction board in connection with the third embodiment of the present invention.

FIG. 21 is an exploded part perspective view of the X-ray imaging apparatus 1 using the current introduction board 310. The X-ray imaging apparatus 1 structured as shown in FIG. 21 includes a current introduction board 310, board coupling components 350 and 360, a chamber 370, a rubber ring 383 used to hermetically seal between the board coupling component 350 and the current introduction board 310, a rubber ring 381 used to hermetically seal between the current introduction board 310 and the board coupling component 360, and a copper gasket 382 used to hermetically seal between the board coupling component 360 and the chamber 370. The rubber rings 381 and 383 are each a sealing component generally called an O-ring, and are each a ring-shaped piece of rubber with a circular sectional shape.

Figure 22:
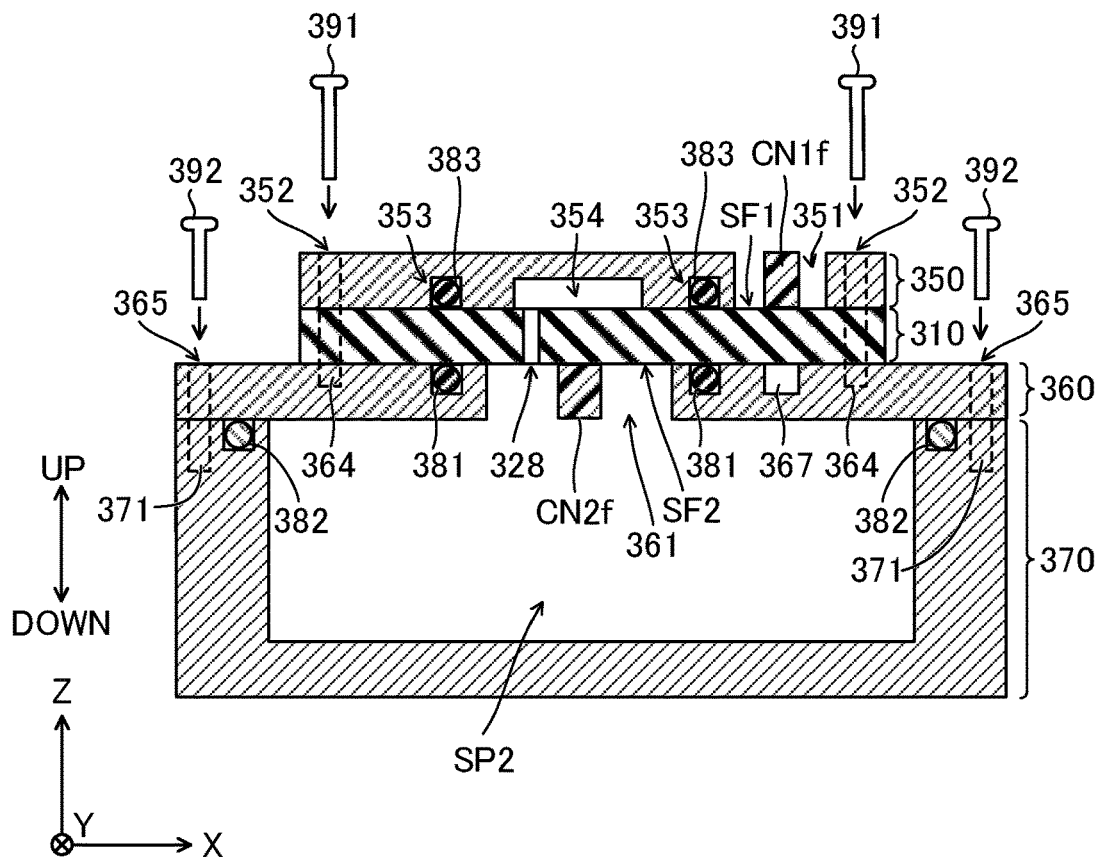
FIG. 22 is a part sectional view of the X-ray imaging apparatus with its components coupled together in connection with the third embodiment of the present invention.

FIG. 22 is a part sectional view of the X-ray imaging apparatus 1 showing how the board coupling component 350 and the current introduction board 310 are joined together via the rubber ring 383, how the current introduction board 310 and the board coupling component 360 are joined together via the rubber ring 381, and how the board coupling component 360 and the chamber 370 are joined together via the gasket 382. The joining-together of the current introduction board 310 and the board coupling components 350 and 360 is achieved by holding the current introduction board 310 between the board coupling components 350 and 360 and fastening them together. FIG. 22 is a sectional view on a sectional plane that does not pass through any of the bolt holes 311 provided in the current introduction board 310 and the bolt holes 352, 364, 365, and 371 (described later) provided in the board coupling components 350 and 360 and in the chamber 370 but that passes through the ventilation hole 328.

It can be understood that the chamber 370 functions as the chamber 20 in FIG. 1 and that the current introduction board 310 and the board coupling components 350 and 360 constitute the current introduction terminal block 10 in FIG. 1. The board coupling component 360 and the chamber 370 may be configured as a unitary chamber (in that case, the copper 382 is not necessary).

The board coupling components 350 and 360 are each a component in the shape of a disc, and the chamber 370 is a component in the shape of a cylinder. The board coupling components 350 and 360 and the chamber 370 are formed of metal such as stainless steel. The center axis of disc defined by the board coupling component 350, the center axis of the disc defined by the board coupling component 360, and the center axis of the cylinder defined by the chamber 370 coincide, and are parallel to the Z axis. So that a peripheral part of the board coupling component 360 may be used to achieve coupling with the chamber 370, the radius of the disc defined by the board coupling component 360 is larger than the radius of the disc defined by the board coupling component 350.

In the board coupling component 350, an opening 351 that penetrates it in the Z-axis direction is provided so that, when the board coupling component 350 and the current introduction board 310 are coupled together, the connector CN1$f$ is located in the opening 351. Although here the opening 351 has a rectangular shape on the XY plane, it may instead have any other shape. A plurality of bolt holes 352 that penetrate the board coupling component 350 between its top and bottom faces are formed in a spread manner at positions surrounding the opening 351.

In a central part of the board coupling component 360, an opening 361 that penetrates it in the Z-axis direction is provided so that, when the board coupling component 360 and the current introduction board 310 are coupled together, the connector CN2$f$ is located in the opening 361 (see FIG. 22). Although here the opening 361 has a rectangular shape on the XY plane, it may instead have any other shape. In the top face 363 of the board coupling component 360, at a position surrounding the opening 361, a ring-shaped groove 362 in which to fit the rubber ring 381 is formed. In FIG. 21, the groove 362 is indicated by a dotted region (a region filled with dots). A plurality of bolt holes 364 that penetrate the board coupling component 360 between its top and bottom faces are formed in a spread manner at positions surrounding the groove 362, and also a plurality of bolt holes 365 that penetrate the board coupling component 360 between its top and bottom faces are formed in a spread manner at positions surrounding the groove 362.

Figure 23:
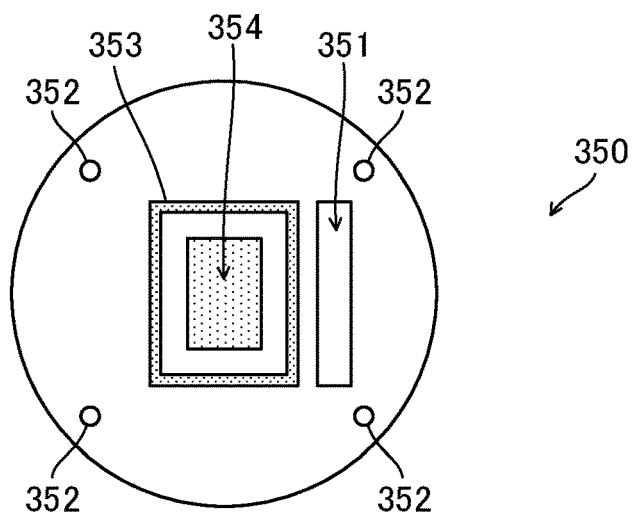
FIG. 23 is a plan view of a board coupling component according to the third embodiment of the present invention.
Figure 24:
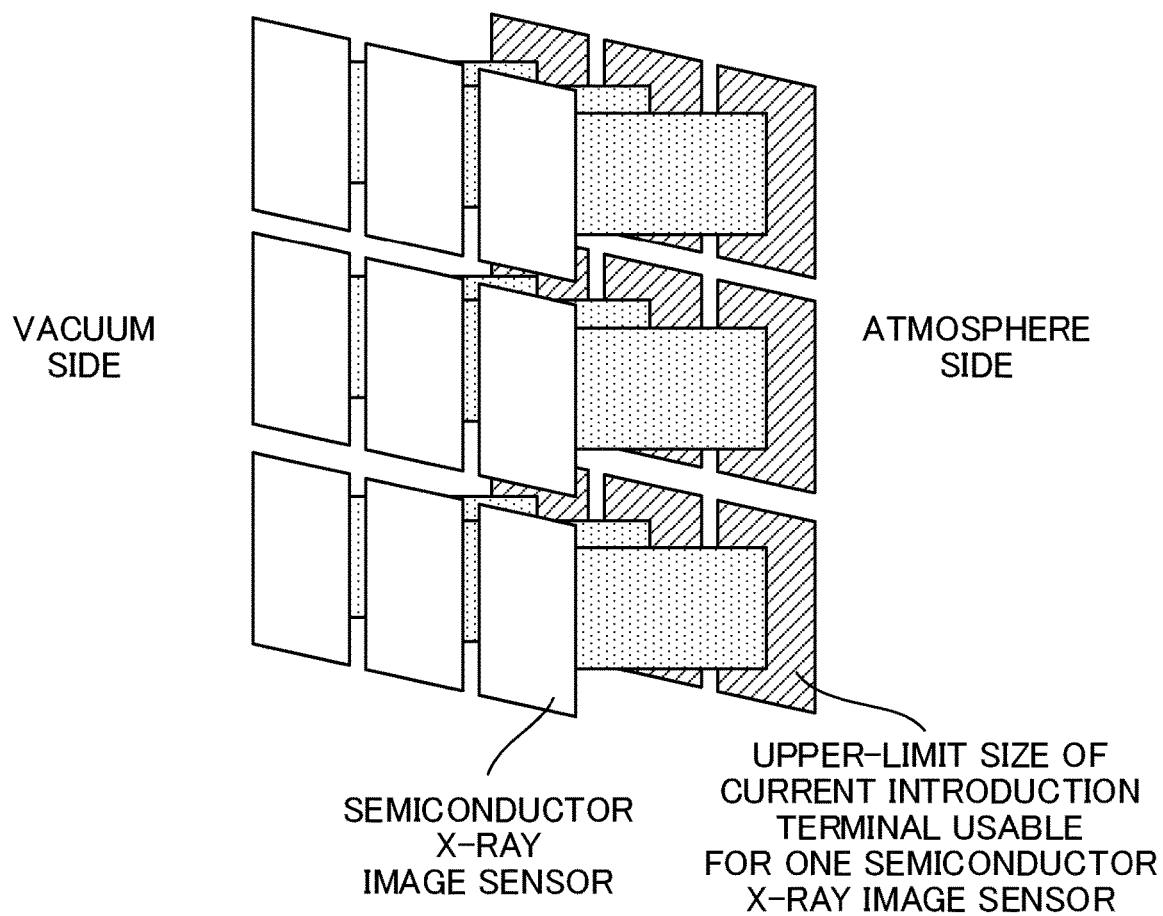
FIG. 24 is a diagram showing a relationship between an X-ray image sensor array and current introduction terminals corresponding to it.

FIG. 23 is a plan view of the board coupling component 350 as seen from below the bottom face of the board coupling component 350 (from below its face facing the face SF1 of the current introduction board 310). In the bottom face of the board coupling component 350, next to the opening 351, a ring-shaped groove 353 in which to fit the rubber ring 383 is formed, and inside (the ring defined by) the groove 353, a recess 354 is provided. In FIG. 23, the groove 353 and the recess 354 are indicated by dotted regions (regions filled with dots). The recess 354 is a depressed area for preventing contact of the metal forming the board coupling component 350 with the metal terminals of the connector CN2$f$ sticking out from the face SF1 (see FIG. 22). As shown in FIG. 21, in the top face 363 of the board coupling component 360, outside the region surrounded by the ring-shaped groove 362, a recess 367 is provided. The recess 367 is a depressed area for preventing contact of the metal forming the board coupling component 360 with the metal terminals of the connector CN1$f$ sticking out from the face SF2 (see FIG. 22).

Whereas the bolt holes 352 in the board coupling component 350 and the bolt holes 311 in the current introduction board 310 are simple cylindrical holes, the bolt holes 364 in the board coupling component 360 have screw threads formed inside. With the rubber ring 383 fitted in the groove 353 and with the rubber ring 381 fitted in the groove 362, the current introduction board 310 is held between the board coupling components 350 and 360; then, by use of the bolt holes 352, 311, and 364, the board coupling component 350, the current introduction board 310, and the board coupling component 360 are coupled together with a plurality of bolts 391. Now, a first predetermined ring-shaped part of the face SF1 of the current introduction board 310 is in close contact with the rubber ring 383, and this prevents passage of fluid (here, gas) between inside and outside the rubber ring 383; likewise, a second predetermined ring-shaped part of the face SF2 of the current introduction board 310 is in close contact with the rubber ring 381, and this prevents passage of fluid (here, gas) between inside and outside the rubber ring 381.

On the face SF1 of the current introduction board 310, at least in the above-mentioned first predetermined ring-shaped part in contact with the rubber ring 383, a gold-plated surface can be formed so as to be exposed. As in the first embodiment, this helps improve the airtightness provided by the rubber ring 383. Likewise, on the face SF2 of the current introduction board 310, at least in the above-mentioned second predetermined ring-shaped part in contact with the rubber ring 381, a gold-plated surface can be formed so as to be exposed. As in the first embodiment, this helps improve the airtightness provided by the rubber ring 381.

In a part 372 of the chamber 370 located in a peripheral part of the top face of the chamber 370, a plurality of bolt holes 371 are formed in a spread manner. Whereas the bolt holes 365 in the board coupling component 360 are simple cylindrical hole, the bolt holes 371 in the chamber 370 have screw threads formed inside. Though not shown in FIG. 21 for the sake of simple illustration, in the part 372, inside the circle passing through the respective centers of the plurality of bolt holes 371, a ring-shaped groove in which to fit the gasket 382 is formed. With the gasket 382 held between this groove and the bottom face of the board coupling component 360, by use of the bolt holes 365 in the board coupling component 360 and the bolt holes 371 in the chamber 370, the board coupling component 360 and the chamber 370 are coupled together with a plurality of bolts 392.

When the board coupling component 350, the current introduction board 310, the board coupling component 360, and the chamber 370 are coupled together as described above, although the metal terminals of the connector CN1$f$ stick out from the face SF2, the parts of the metal terminals that stick out are accommodated in the recess 367, where no metal is present, and thus contact between the metal terminals and the board coupling component 360 is avoided; likewise, although the metal terminals of the connector CN2$f$ stick out from the face SF1, the parts of the metal terminals that stick out are accommodated in the recess 354, where no metal is present, and thus contact between the metal terminals and the board coupling component 350 is avoided. When the board coupling component 350, the current introduction board 310, the board coupling component 360, and the chamber 370 are coupled together as described above, a first space surrounded by the recess 354 and the face SF1 of the current introduction board 310, a second space which is the space inside the ventilation hole 328, and a third space surrounded by the inner wall of the board coupling component 360 (the circumferential wall of the opening 361) and the inner wall of the chamber 370 communicate with each other, so that the first to third spaces together constitute the space SP2 to be kept under a vacuum.

Though not shown in FIG. 22 (see FIG. 1), in the space SP1, the metal terminals of the connector CN1f are connected to the sensor driver/signal processor 50 via the wiring bunch WR1 comprising a plurality of wirings; in the space SP2, the metal terminals of the connector CN2f are connected to the X-ray image sensor 40 via the wiring bunch WR2 comprising a plurality of wirings. The wirings that constitute the wiring bunch WR1 may be cables or may include patterns on a board. Similar description applies to the wiring bunch WR2.

The sensor driver/signal processor 50 and the X-ray image sensor 40 are connected together via the wiring bunch WR1, the metal terminals of the connector CN1f, the through via holes 313 and 314 and the inner-layer wiring 315 (see FIG. 20) formed in the current introduction board 310, the metal terminals of the connector CN2f, and the wiring bunch WR2, so that, via these, a plurality of electric signals (including, for example, a sensor control signal and an imaging signal) can be transmitted and received independently of each other and in addition the sensor driver/signal processor 50 can supply driving electric power to the X-ray image sensor 40.

The third embodiment provides effects, including an increased contact arrangement density, similar to those that the first embodiment provides.

Although the description above deals with an example where only one connector is mounted on the face SF1 of the current introduction board 310, instead, a plurality of connectors can be mounted on the face SF1 of the current introduction board 310. Likewise, a plurality of connectors can be mounted on the face SF2 of the current introduction board 310.

The rubber rings 381 and 383 can be given the same shape and the same size so that, with the rubber rings 381 and 383 arranged at positions opposite each other across the current introduction board 310 (see FIG. 22), the board coupling components 350 and 360 and the current introduction board 310 are coupled together. This prevents the pressure difference (air pressure difference) between the SP1 and SP2 from acting on any part of the current introduction board 310 in its thickness direction, and thus helps reduce the thickness of the current introduction board 310.

Fourth Embodiment

A fourth embodiment of the present invention will be described. The fourth embodiment gives a supplemental description of any or all of the basic embodiment and the first to third embodiments described above and an additional description of various application examples and modified examples applicable to any or all of the basic embodiment and the first to third embodiments described above. The fourth embodiment includes Practical Examples EX4_1 to EX4_9 presented below. Unless inconsistent, any feature described in connection with any of Practical Examples EX4_1 to EX4_9 can be applied to any other of the practical examples. In the following description of Practical Examples EX4_1 to EX4_9, features that are basically common to more than one of the embodiments described previously are discussed, and accordingly components are often mentioned without being followed by reference signs. For example, in the following description of Practical Examples EX4_1 to EX4_9, what is mentioned simply as "current introduction board" refers to any relevant one of the current introduction boards 11, 110, 210, and 310.

Practical Example EX4_1

Practical Example EX4_1 will be described. In the first to third embodiments described previously, for every two sets of wirings, signals can be transmitted and received at a rate of 10 Gpbs (gigabits per second). With the structure of the first embodiment in particular, as mentioned earlier, rectilinear introduction of electric currents and wirings facilitates the designing of distributed parameters, and is advantageous in bandwidth widening. Rectilinear introduction also contributes to a higher density, and allows clear wiring designing.

With the structures according to the second and third embodiments, laying wirings in an inner layer results in offsets between contact positions on the face SF1 and contact positions on the face SF2, and the offsets require an extra area in the layout (in other words, lead to a lower contact introduction density) as compared with in the first embodiment. However, in the second and third embodiments, providing two or more inner layers in the current introduction board permits the inner-layer wirings constituting one unit current introducer and the inner-layer wirings constituting another unit current introducer to cross each other within the inner layers in the current introduction board; such a crossing layout helps mitigate the above-mentioned disadvantage resulting from offsets.

Practical Example EX4_2

Practical Example EX4_2 will be described. In the second or third embodiment, as a connector to be mounted on the face SF1 or SF2 of the current introduction board, a surface-mount connector can be used and a through-hole connector can also be used. By contrast, in the first embodiment, as a connector to be mounted on the face SF1 or SF2 of the current introduction board, only a surface-mount connector can be used. This does not pose a problem in most cases because, as wide-band connectors, surface-mount connectors are chiefly in practical use and commercially available.

As mentioned in connection with Practical Example EX1_4 belonging to the first embodiment, in the second or third embodiment, cables such as flexible cables can be connected directly to contacts (metal parts such as pads, lands, or the like that are supposed to conduct to the metal terminals of the connector CN1e or CN1f) on the face SF1 of the current introduction board, and cables such as flexible cables can be connected directly to contacts (metal parts such as pads, lands, or the like that are supposed to conduct to the metal terminals of the connector CN2e or CN2f) on the face SF2 of the current introduction board.

Practical Example EX4_3

Practical Example EX4_3 will be described. As described above, in the embodiments of the present invention, various types of general-purpose connectors can be mounted on the current introduction board, and this provides a great advantage over the conventional technology of which the application is limited to the conventional pin structure as shown in FIG. 25 or disclosed in Non-Patent Document 1. In this connection, in the embodiments of the present invention, as connectors (CN1a to CN1f, CN2a to CN2f) that can be mounted on the current introduction board, not only male-terminal connectors with a straight structure but also femaleterminal connectors generally with a complex structure including springs or the like can be used (this is impossible with the above-mentioned conventional technology). Liberation from the restriction of conventional current introduction terminals being compatible only with male terminals leads to tremendously high flexibility in the choice and design of connectors.

The pitch (contact interval in the X-axis or Y-axis direction) of contacts (pads or lands) provided on the current introduction board may be equal or different between the faces SF1 and SF2. The conventional pin structure as shown in FIG. 25 or disclosed in Non-Patent Document 1 is subject to the restriction requiring an equal pitch on the atmosphere side and the vacuum side.

Practical Example EX4_4

Practical Example EX4_4 will be described. The above description chiefly assumes that the current introduction board is formed out of a glass epoxy board. Instead, the current introduction board can be formed of any printed board that is not classified as an glass epoxy board. For example, the current introduction board can be formed out of a ceramic board.

In the second and third embodiments, forming the current introduction board out of a ceramic board permits the entire chamber having the current introduction board coupled to it to be baked, and this makes it possible to cope with an ultra-high vacuum (e.g., a vacuum of about $10^{-9}$ Torr). In the second and third embodiments, in a case where a ceramic board is used to cope with an ultra-high vacuum, the ceramic board and a board coupling component can be coupled together, instead of by use of a rubber ring, by metallization-brazing (i.e., the ceramic board is subjected to metallization and is coupled directly to the board coupling component by brazing).

Also in the first embodiment, the current introduction board can be formed of a ceramic board. Even then, however, the presence of the filling material (e.g., a resin material) that fills through via holes makes it impossible to bake the current introduction board. Thus, forming the current introduction board out of a ceramic board has no or little advantage.

In the first to third embodiments, mirror surface treatment can be applied to the components in contact with the space SP2 to reduce outgas.

In the first to third embodiments, in a case where the individual cables in the wiring bunch WR2 within the space SP2 are coated with an electrically insulating coat of resin, as the resin, a resin with a low-outgas property (e.g., polyimide, polytetrafluoroethylene) can be used.

In the first to third embodiments, a gas vent hole can be formed in the case of a connector arranged inside the space SP2. When a connector mounted on the space SP2 of the current introduction board and the connector that is supposed to be connected to that connector are connected together in the atmosphere, air is trapped in the space (air cavity) inside the cases of the two connected connectors. When subsequently the space SP2 is vacuumed, the air trapped inside the connector cases may keep leaking into the space SP2 for a long time and may thereby hinder a rapid increase in the degree of vacuum. The gas vent hole is a hole that penetrates the circumferential face of the connector cases out of the above-mentioned space (air cavity). Providing the gas vent hole helps restrain the trapping of air during vacuuming.

Practical Example EX4_5

Practical Example EX4_5 will be described. In the embodiments described above, the current introduction board can be given any thickness. Increasing the thickness of the current introduction board as necessary helps improve the mechanical strength of the current introduction board and increase the withstand pressure. Also appropriately selecting the material of the current introduction board in accordance with the pressure difference between inside and outside the chamber (i.e., the air pressure difference between the spaces SP2 and SP1) helps improve the mechanical strength and the withstand pressure of the current introduction board to cope with the pressure difference.

In particular in a case where a through-hole connector is mounted on the current introduction board, when the connector that is supposed to be connected to that through-hole connector is plugged into it to be connected to it, stress may act on the part where the through-hole connector is mounted and may damage the current introduction board (the current introduction board may break or develop a crack). In such a case, a flange can be provided on the face of the current introduction board opposite from the face on which the through-hole connector is mounted, thereby to prevent damage as just mentioned. This is particularly useful with a thin current introduction board; a thick current introduction board does not necessarily require such a flange. With a thick current introduction board, the current introduction board itself can be configured to function as a flange.

Practical Example EX4_6

Practical Example EX4_6 will be described. By adjusting the width of metal wirings provided on the current introduction board, the permissible current can be designed as desired. By increasing the width, it is possible to increase the surface area of metal wirings and cope with high currents. Forming the current introduction board by using an aluminum nitride ceramic helps boost heat dissipation efficiency. Through adjustment of the wiring-to-wiring distance and the layer-to-layer distance in the current introduction board and selection of the material of the current introduction board, the permissible voltage can also be designed as desired.

Practical Example EX4_7

Practical Example EX4_7 will be described. In the first to third embodiments, the coupling among the current introduction board, the board coupling component, and the chamber can be achieved in any of various manners other than specifically described above. Although the above description deals with examples where screw threads are formed in bolt holes in the board coupling component and the chamber, instead, the coupling among the current introduction board, the board coupling component, and the chamber can be achieved by use of bolts and nuts with a flange or the like provided as necessary.

Practical Example EX4_8

Practical Example EX4_8 will be described. A current introduction board according to the present invention introduces an electric current (an electric signal conveying data, or electric power) from outside a chamber 20 to inside the chamber 20 or introduces an electric current (an electric signal conveying data, or electric power) from inside a chamber 20 to outside the chamber 20 while keeping different the environment inside the chamber 20 and the environment outside the chamber 20.

Differences between the environment inside the chamber 20 and the environment outside the chamber 20 can include a difference in air pressure. Typically, as mentioned earlier, the pressure inside the chamber 20 (the air pressure in the space SP2) is lower than the pressure outside the chamber 20 (the air pressure in the space SP1), but this can be reversed. Thus, the X-ray imaging apparatus in FIG. 1 can be understood to include an air pressure holding apparatus that is formed by coupling together a plurality of components including a chamber 20 and a current introduction terminal block 10 and that keeps the air pressure inside the chamber 20 different from the air pressure outside the chamber 20. The just-mentioned plurality of components of the air pressure holding apparatus can be understood to include a vacuum pump 60, and can be understood to include, in the first to third embodiments, also a rubber ring, a gasket, and a board coupling component.

A difference between inside the chamber 20 and outside the chamber 20 may be one in humidity, in temperature, or in the type of gas present. The apparatus that keeps different the environment inside the chamber 20 and the environment outside the chamber 20 (in FIG. 1, the apparatus configured to include the chamber 20 and the vacuum pump 60) is provided with the function of restraining passage of fluid between inside the chamber 20 and outside the chamber 20, and the fluid, although it is gas in the embodiments described previously, may include liquid.

Practical Example EX4_9

Practical Example EX4_9 will be described. Although the X-ray imaging apparatus discussed in connection with the embodiments described previously is an X-ray image sensing apparatus, which a kind of image sensing apparatus, the present invention is applicable to any image sensing apparatuses. Specifically, the X-ray image sensor 40 described above can be replaced with a visible light image sensor or a radiation image sensor to form a visible light image sensing apparatus or a radiation image sensing apparatus. Whereas the X-ray image sensor 40 described above receives X rays as incident light to output an imaging signal conveying the optical image of the incident light, a visible light image sensor receives visible light as incident light to output an imaging signal conveying the optical image of the incident light, and a radiation image sensor receives radiation as incident light to output an imaging signal conveying the optical image of the incident light. Here, radiation includes at least gamma rays and X rays, and can further include ultraviolet rays (in particular, for example, extreme ultraviolet rays). The X-ray image sensor 40 described above can be replaced with an image sensor for electronic microscopes, and this allows an electronic microscope to be formed as an image sensing apparatus.

Application of the present invention is not limited to image sensing apparatuses. Specifically, the device that is provided inside the chamber 20 and that is connected to the wiring bunch WR2 is not limited to an image sensor, and can be any device that is supplied with electric power and that transmits and receives an electric signal via the wiring bunch WR2. For example, the present invention finds wide applications in X-ray detectors, soft X-ray detectors, EUV (extreme ultraviolet) detectors, and TEMs (transmission electron microscopes) and further in accelerators, semiconductor manufacturing apparatuses, space industry equipment, etc.

<<Overview>>

To follow is an overview of the present invention.

A current introduction terminal $W_1$ according to one aspect of the present invention is a current introduction terminal (e.g., 10) for introducing an electric current into a chamber (e.g., 20, 170) while keeping the chamber airtight, and includes comprising: an insulating board (e.g. 11, 110) of resin that has, as two faces that are opposite each other, a first face (e.g., SF1) to be placed in the environment outside the chamber and a second face (e.g., SF2) to be placed in the environment inside the chamber and that separates from each other the environment outside the chamber and the environment inside the chamber. A plurality of through via holes are formed in the insulating board to penetrate the insulating board between the first and second faces, and the through via holes have their respective hole parts filled by a predetermined filling material (e.g., 133). On each of the first and second faces, a plurality of pads (e.g., PD1, PD2) of metal that respectively cover the hole parts of the through via holes are formed so as to allow transfer of electric power or an electric signal between the first and second faces while restraining passage of fluid between the first and second faces through the hole parts.

With this structure, it is possible to lay wirings (introduce electric currents) with a high density that far exceeds the limit of conventional technologies while keeping the chamber airtight. The structure is simple and extremely easy to manufacture as compared with the conventional pin structure as shown in FIG. 25 or disclosed in Non-Patent Document 1, greatly reducing the required costs (e.g., to about 1/10) and allowing mass-production. It is also expected that commercially available general-purpose connectors can be freely selected and used on each of the first and second faces, leading to tremendously high flexibility.

Specifically, for example, in the current introduction terminal $W_1$, preferably, on each of the first and second faces, the pads serve as connection surfaces with the terminals that are supposed to conduct to the pads, and the pads avoid exposure of the filling material. Preferably, the filling material s a resin material.

By using pads needed for current introduction also as components for avoiding exposure of the filling material (in other words, by using components for avoiding exposure of the filling material as pads for current introduction), it is possible to achieve high-density current introduction while restraining trouble resulting from exposure of the filling material (e.g., the effect of outgas).

For example, in the current introduction terminal $W_1$, preferably, on a plurality of first pads formed on the first face, a first surface-mount connector (e.g., CN1*a*) having a plurality of metal terminals are mounted, and on a plurality of second pads formed on the second face, a second surface-mount connector (e.g., CN2*a*) having a plurality of metal terminals are mounted. Preferably, the plurality of metal terminals of the first surface-mount connector are made to conduct to the plurality of metal terminals of the second surface-mount connector via the plurality of first pads, the plurality of through via holes, and the plurality of second pads.

With this structure, it is possible to introduce electric currents at an extremely high density. Rectilinear introduction of electric currents and wirings facilitates the designing of distributed parameters, and is advantageous in bandwidth widening.

In that case, for example, in the current introduction terminal $W_1$, preferably, a plurality of sets each comprising the plurality of first pads, the plurality of through via holes, and the plurality of second pads are provided on a shared insulating board as the insulating board, and the first and second surface-mount connectors for each of the plurality of sets are mounted on the shared insulating board.

An air pressure holding apparatus W2 according to another aspect of the present invention is an air pressure holding apparatus formed by coupling together a plurality of components including a chamber and a current introduction terminal so as to keep an air pressure inside the chamber different from an air pressure outside the chamber, and includes, as the current introduction terminal, the current introduction terminal $W_1$.

An X-ray image sensing apparatus W3 according to yet another aspect of the present invention includes: a plurality of X-ray image sensors disposed inside a chamber (e.g., 20 or 170) the air pressure inside which is kept lower than in the outer space; a signal processing circuit (e.g., 50) for the X-ray image sensors that is disposed outside the chamber; and the current introduction terminal $W_1$ as a current introduction terminal for making the plurality of X-ray image sensors conduct to the signal processing circuit while keeping the chamber airtight.

The embodiments of the present invention allow for many modifications made as necessary within the scope of the technical concept set forth in the appended claims. The embodiments described above are merely examples of how the present invention can be implemented, and the senses of the terms used to define the present invention and its features are not limited to those in which they are used in the description of the embodiments given above. All specific values mentioned in the above description are merely examples, and can naturally be altered to different values.

REFERENCE SIGNS LIST

1 X-ray imaging apparatus
10 current introduction terminal block
20 chamber
30 X-ray transmitting window
40 X-ray image sensor
50 sensor driver/signal processor
60 vacuum pump
11, 110, 210, 310 current introduction board
SP1, SP2 space
SF1, SF2 face
CN1a to CN1f, CN2a to CN2f connector
PD1, PD2 pad

The invention claimed is:

1. A current introduction terminal comprising:
a board made of resin that has a first face and a second face opposite each other and that hermetically separates environments of different air pressures from each other;
a first surface-mount connector on the first face; and
a second surface-mount connector on the second face, wherein
the first surface-mount connector comprises a first case made of an insulating material,
the first case comprises:
a plurality of terminals for connecting a first wiring bunch; and
a plurality of metal terminals protruding from the first case for mounting the first surface-mount connector on the first surface,
the second surface-mount connector comprises a second case made of the insulating material,
the second case comprises:
a plurality of terminals for connecting a second wiring bunch; and
a plurality of metal terminals protruding from the second case for mounting the second surface-mount connector on the second surface,
the plurality of metal terminals of the first surface-mount connector and the plurality of metal terminals of the second surface-mount connector are arrayed with an equal pitch,
a plurality of through via holes corresponding both to the plurality of metal terminals of the first surface-mount connector and to the plurality of metal terminals of the second surface-mount connector are formed to penetrate between the first and second faces,
hole parts of the through via holes are filled with resin,
a first metal film pad group is formed on the first face and a second metal film pad group is formed on the second face such that, for each of the through via holes, the hole part thereof filled with the resin is covered with no gap from opposite sides,
the plurality of metal terminals of the first surface-mount connector are connected to the first metal film pad group and the plurality of metal terminals of the second surface-mount connector are connected to the second metal film pad group such that a rectilinear current introduction path is formed via the through via holes between corresponding ones of the metal terminals of the first surface-mount connector and the metal terminals of the second surface-mount connector, and
the rectilinear current introduction path is formed between the first wiring bunch and the second wiring bunch through the current introduction terminal.

2. The current introduction terminal according to claim 1, wherein
the current introduction terminal introduces an electric current into a chamber while keeping the chamber airtight, and
the board is an insulating board having, as two faces opposite each other, the first face to be placed in an environment outside the chamber and the second face to be placed in an environment inside the chamber, the insulating board separating the environments outside and inside the chamber from each other.

3. The current introduction terminal according to claim 1, wherein
the board is provided with a plurality of sets each including the first metal film pad group, the plurality of through via holes, and the second metal film pad group, and for each of the sets, the first and second surface-mount connectors are mounted on the board.

4. The current introduction terminal according to claim 1, wherein
for each of the through via holes, a first metal film pad is formed on the first face and a second metal film pad is formed on the second face such that the hole part filled with the resin is covered with no gap from opposite sides, and thereby the first and second metal film pad groups corresponding to the plurality of through via holes are formed on the first and second faces.

5. The current introduction terminal according to claim 1, wherein
individual metal film pads constituting the first and second metal film pad groups are each formed of a metal film having copper, nickel, and gold stacked on each other.

6. An air pressure holding apparatus formed by coupling together a plurality of components including a chamber and a current introduction terminal so as to keep an air pressure inside the chamber different from an air pressure outside the chamber, the air pressure holding apparatus comprising, as the current introduction terminal:
the current introduction terminal according to claim 1.

7. An air pressure holding apparatus formed by coupling together a plurality of components including a chamber and a current introduction terminal so as to keep an air pressure inside the chamber different from an air pressure outside the chamber, the air pressure holding apparatus comprising, as the current introduction terminal:
the current introduction terminal according to claim 2.

8. An air pressure holding apparatus formed by coupling together a plurality of components including a chamber and a current introduction terminal so as to keep an air pressure inside the chamber different from an air pressure outside the chamber, the air pressure holding apparatus comprising, as the current introduction terminal:
the current introduction terminal according to claim 3.

9. An air pressure holding apparatus formed by coupling together a plurality of components including a chamber and a current introduction terminal so as to keep an air pressure inside the chamber different from an air pressure outside the chamber, the air pressure holding apparatus comprising, as the current introduction terminal:
the current introduction terminal according to claim 4.

10. An air pressure holding apparatus formed by coupling together a plurality of components including a chamber and a current introduction terminal so as to keep an air pressure inside the chamber different from an air pressure outside the chamber, the air pressure holding apparatus comprising, as the current introduction terminal:
the current introduction terminal according to claim 5.

11. An X-ray image sensing apparatus comprising:
an X-ray image sensor disposed inside a chamber an air pressure inside which is kept lower than in an outer space;
a signal processing circuit for the X-ray image sensor, the signal processing circuit being disposed outside the chamber; and
a current introduction terminal for making the X-ray image sensor conduct to the signal processing circuit while keeping the chamber airtight, wherein
the current introduction terminal includes a board made of resin, the board having a first face and a second face opposite each other, the board hermetically separating environments of different air pressures from each other,
a plurality of through via holes corresponding both to a plurality of metal terminals of a first surface-mount connector to be mounted on the first face and to a plurality of metal terminals of a second surface-mount connector to be mounted on the second face are formed to penetrate between the first and second faces, and then hole parts of the through via holes are filled with resin,
a first metal film pad group is formed on the first face and a second metal film pad group is formed on the second face such that, for each of the through via holes, the hole part thereof filled with the resin is covered with no gap from opposite sides and
the metal terminals of the first and second surface-mount connectors are connected to the first and second metal film pad groups respectively, the second metal film pad group being connected to the first metal film pad group rectilinearly via the plurality of through via holes.

12. An X-ray image sensing apparatus comprising:
an X-ray image sensor disposed inside a chamber an air pressure inside which is kept lower than in an outer space;
a signal processing circuit for the X-ray image sensor, the signal processing circuit being disposed outside the chamber; and
a current introduction terminal for making the X-ray image sensor conduct to the signal processing circuit while keeping the chamber airtight, wherein
the current introduction terminal comprises:
a board made of resin that has a first face and a second face opposite each other and hermetically separates environments of different air pressures from each other,
a first surface-mount connector on the first face; and
a second surface-mount connector on the second face,
the first surface-mount connector and the second surface-mount connector each have a plurality of metal terminals,
the plurality of metal terminals of the first surface-mount connector and the plurality of metal terminals of the second surface-mount connector are arrayed with an equal pitch,
a plurality of through via holes corresponding both to the plurality of metal terminals of the first surface-mount connector and to the plurality of metal terminals of the second surface-mount connector are formed to penetrate between the first and second faces,
hole parts of the through via holes are filled with resin,
a first metal film pad group is formed on the first face and a second metal film pad group is formed on the second face such that, for each of the through via holes, the hole part thereof filled with the resin is covered with no gap from opposite sides, and
the metal terminals of the first surface-mount connector are connected to the first metal film pad group and the metal terminals of the second surface-mount connector are connected to the second metal film pad group such that a rectilinear current introduction path is formed via the through via holes between corresponding ones of the metal terminals of the first surface-mount connector and the metal terminals of the second surface-mount connector.

13. An X-ray image sensing apparatus comprising:
a plurality of X-ray image sensors disposed inside a chamber an air pressure inside which is kept lower than in an outer space;
a signal processing circuit for the X-ray image sensors, the signal processing circuit being disposed outside the chamber; and
a current introduction terminal for making the plurality of X-ray image sensors conduct to the signal processing circuit while keeping the chamber airtight, wherein
the current introduction terminal includes a board having a first face and a second face opposite each other, the board forming a partition of the chamber,
the current introduction terminal includes a plurality of connector pairs, each connector pair including a first surface-mount connector disposed on the first face and a second surface-mount connector disposed on the second face so as to correspond to the first surface-mount connector,
in each connector pair, the first surface-mount connector and the second surface-mount connector each have a plurality of metal terminals and the plurality of metal terminals of the first surface-mount connector and the plurality of metal terminals of the second surface-mount connector are arrayed with an equal pitch,
for each connector pair, a plurality of through via holes corresponding both to the plurality of metal terminals of the first surface-mount connector and to the plurality of metal terminals of the second surface-mount connector are formed to penetrate between the first and second faces and hole parts of the through via holes are filled with resin, for each connector pair, a first metal film pad group is formed on the first face and a second metal film pad group is formed on the second face such that, for each of the through via holes, the hole part thereof filled with the resin is covered with no gap from opposite sides, and for each connector pair, the metal terminals of the first surface-mount connector are connected to the first metal film pad group and the metal terminals of the second surface-mount connector are connected to the second metal film pad group such that a rectilinear current introduction path is formed via the through via holes between corresponding ones of the metal terminals of the first surface-mount connector and the metal terminals of the second surface-mount connector.

14. A current introduction terminal comprising:
a board made of resin that has:
 a first face and a second face opposite each other, and hermetically sealed through via holes,
a first surface-mount connector that comprises a first case on the first face that is formed of an insulating material; and
a second surface-mount connector that comprises a second case on the second face that is formed of the insulating material, wherein the first case comprises:
 a plurality of metal terminals for mounting the first surface-mount connector on the first face; and
 a plurality of connecting terminals for connecting a first wiring bunch, the second case comprises:
 a plurality of metal terminals for mounting the second surface-mount connector on the second face; and
 a plurality of connecting terminals for connecting a second wiring bunch, a first metal film pad group corresponding to the through via holes is formed on the first face, a second metal film pad group corresponding to the through via holes is formed on the second face, and the plurality of metal terminals of the first surface-mount connector are connected to the first metal film pad group and the plurality of metal terminals of the second surface-mount connector are connected to the second metal film pad group such that a current introduction path is formed via the through via holes between corresponding ones of the connecting terminals of the first case of the first surface-mount connector and the connecting terminals of the second case of the second surface-mount connector.

* * * * *